(12) United States Patent
Sikka et al.

(10) Patent No.: US 11,887,908 B2
(45) Date of Patent: Jan. 30, 2024

(54) ELECTRONIC PACKAGE STRUCTURE WITH OFFSET STACKED CHIPS AND TOP AND BOTTOM SIDE COOLING LID

(71) Applicant: International Business Machines Corporation, Armonk, NY (US)

(72) Inventors: Kamal K. Sikka, Poughkeepsie, NY (US); Katsuyuki Sakuma, Fishkill, NY (US); Hilton T. Toy, Hopewell Junction, NY (US); Shidong Li, Hopewell Junction, NY (US); Ravi K Bonam, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 85 days.

(21) Appl. No.: 17/557,529

(22) Filed: Dec. 21, 2021

(65) Prior Publication Data
US 2023/0197552 A1  Jun. 22, 2023

(51) Int. Cl.
| | | |
|---|---|---|
| *H01L 23/367* | (2006.01) | |
| *H01L 23/053* | (2006.01) | |
| *H01L 23/31* | (2006.01) | |
| *H01L 25/065* | (2023.01) | |
| *H01L 23/46* | (2006.01) | |
| *H01L 25/00* | (2006.01) | |
| *H01L 23/00* | (2006.01) | |

(52) U.S. Cl.
CPC ......... *H01L 23/367* (2013.01); *H01L 23/053* (2013.01); *H01L 23/3107* (2013.01); *H01L 23/46* (2013.01); *H01L 24/08* (2013.01); *H01L 25/0657* (2013.01); *H01L 25/50* (2013.01); *H01L 2224/08145* (2013.01); *H01L 2225/0651* (2013.01); *H01L 2225/06506* (2013.01); *H01L 2225/06562* (2013.01); *H01L 2225/06589* (2013.01)

(58) Field of Classification Search
CPC . H01L 23/367; H01L 23/053; H01L 23/3107; H01L 25/0657; H01L 2225/06506; H01L 2225/0651; H01L 2225/06562; H01L 2225/06589; H01L 23/46
See application file for complete search history.

(56) References Cited

U.S. PATENT DOCUMENTS

| | | | |
|---|---|---|---|
| 5,045,685 A | | 9/1991 | Wall |
| 6,433,421 B2 | | 8/2002 | Masuda et al. |
| 7,466,020 B2 | | 12/2008 | Eckardt et al. |
| 7,795,726 B2 | | 9/2010 | Myers et al. |
| 7,893,529 B2 | | 2/2011 | Hsu |
| 7,986,543 B2 | | 7/2011 | Emma |
| 8,084,851 B2 | | 12/2011 | Trezza |
| 8,299,608 B2 | | 10/2012 | Bartley |
| 8,872,330 B2 | | 10/2014 | Herrmann et al. |
| 8,901,750 B2 | | 12/2014 | Park et al. |
| 8,946,878 B2 | | 2/2015 | Chin et al. |
| 9,337,119 B2 * | | 5/2016 | Vadhavkar ............ H01L 23/473 |
| 11,211,378 B2 * | | 12/2021 | Farooq .................... H01L 25/50 |
| 11,581,234 B2 * | | 2/2023 | Kim .................... H01L 23/3677 |

(Continued)

*Primary Examiner* — Eugene Lee
(74) *Attorney, Agent, or Firm* — Stephen R. Yoder

(57) ABSTRACT

An electronic structure includes offset three-dimensional stacked chips; and a two-piece lid structure configured to extract heat from the bottom and top of the stacked chips.

20 Claims, 27 Drawing Sheets

(56) References Cited

U.S. PATENT DOCUMENTS

| | | | |
|---|---|---|---|
| 11,664,318 B2* | 5/2023 | Melikyan | H01L 25/167 257/774 |
| 2013/0119528 A1* | 5/2013 | Groothuis | H01L 23/3675 257/777 |
| 2014/0015598 A1* | 1/2014 | Groothuis | H01L 23/34 438/107 |
| 2015/0108662 A1* | 4/2015 | Chen | H01L 25/0652 257/777 |
| 2015/0121331 A1 | 4/2015 | Matsumoto | |
| 2015/0279787 A1* | 10/2015 | Kim | H01L 25/0657 438/109 |
| 2016/0181125 A1* | 6/2016 | Li | H01L 21/563 438/107 |
| 2018/0012865 A1* | 1/2018 | Schrock | H01L 23/3675 |
| 2018/0108592 A1* | 4/2018 | Hembree | H01L 23/367 |
| 2019/0326192 A1* | 10/2019 | Eid | H01L 23/3675 |
| 2020/0294817 A1* | 9/2020 | Hung | H01L 23/367 |
| 2021/0118854 A1 | 4/2021 | Sikka | |
| 2021/0202352 A1* | 7/2021 | Kim | H01L 25/0657 |
| 2022/0013445 A1* | 1/2022 | Kim | H01L 23/49838 |
| 2022/0045010 A1* | 2/2022 | Shin | H01L 24/73 |
| 2022/0376467 A1* | 11/2022 | Modak | H01S 5/4012 |
| 2023/0114652 A1* | 4/2023 | Yu | H01L 21/31053 438/109 |

* cited by examiner

| FIG.10A | FIG.10B | FIG.10C | FIG.10D |
FIG.10
ENHANCED COOLING 2D
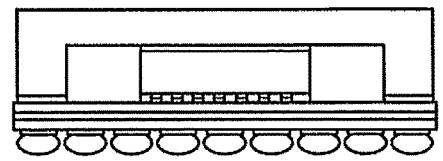
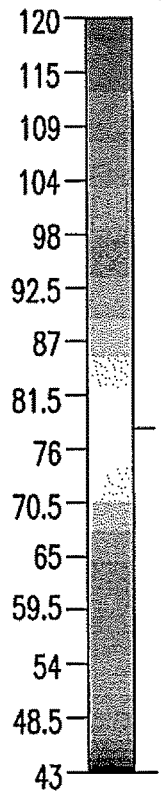
TEMPERATURE (degC)
```
CHIP=25mm x 25mm
LAMINATE=68.5mm x 68.5mm
TOTAL CHIP POWER=500W
COOLING=50000W/m²K eff.
Ta=43°C
```
CHIP 1
(INCL. 106)
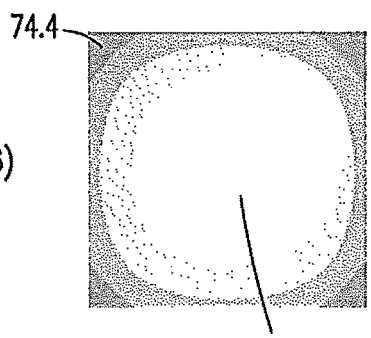
74.4
77.9
FIG.10A

ELECTRONIC PACKAGE STRUCTURE WITH OFFSET STACKED CHIPS AND TOP AND BOTTOM SIDE COOLING LID

BACKGROUND

The exemplary embodiments described herein relate generally to electronic package design, more specifically, to an electronic package structure with offset stacked chips and top and bottom side cooling lid.

BRIEF SUMMARY

In one aspect, an electronic structure includes offset three-dimensional stacked chips; and a two-piece lid structure configured to extract heat from the bottom and top of the stacked chips.

In another aspect, a method includes dispensing seal adhesive on a laminate where a first piece of a lid structure joins with the laminate, and placing the first piece of the lid structure on the laminate; reflowing a first chip of a set of stacked chips to the laminate; dispensing thermal interface material on a ledge of the first piece of the lid structure between a second chip of the set of stacked chips and the first chip, and reflowing the second chip to the first chip; dispensing underfill on the laminate and open surfaces of the chips that are joined with a second piece of the lid structure, and dispensing thermal interface material on the open surfaces of the chips next to the underfill; dispensing seal adhesive on the laminate where the second piece of the lid structure joins with the laminate; dispensing seal adhesive on the first piece of the lid structure where the first piece of the lid structure joins with the second piece of the lid structure; dispensing thermal interface material on a chip with an open surface that spans a part of the second piece of the lid structure; placing the second piece of the lid structure on the laminate; and curing the underfill, the seal adhesive, and the thermal interface material.

In another aspect, a method includes fabricating at least two silicon wafers having a thickness of a first chip of a set of offset stacked chips; fabricating at least two silicon on insulator wafers having a thickness corresponding to a difference between the first chip and a second chip of the set of offset stacked chips; bonding a first one of the silicon wafers to a first one of the silicon on insulator wafers; and bonding a second one of the silicon wafers to a second one of the silicon on insulator wafers, such that the first one of the silicon on insulator wafer is offset from the second one of the silicon on insulator wafer.

BRIEF DESCRIPTION OF THE SEVERAL VIEWS OF THE DRAWINGS

The foregoing and other aspects of exemplary embodiments are made more evident in the following Detailed Description, when read in conjunction with the attached Drawing Figures, wherein:

FIG. 10A, FIG. 10B, FIG. 10C, and FIG. 10D (collectively, FIG. 10) illustrate enhanced cooling of the structure having offset stacked chips with a top and bottom side cooling lid.

DETAILED DESCRIPTION

The term "exemplary" is used herein to mean "serving as an example, instance, or illustration." Any embodiment described herein as "exemplary" is not necessarily to be construed as preferred or advantageous over other embodiments. All of the embodiments described in this Detailed Description are exemplary embodiments provided to enable persons skilled in the art to make or use the invention and not to limit the scope of the invention which is defined by the claims.

Described herein is an electronic package structure with offset stacked chips and a top and bottom side cooling lid.

Also described herein is a method to mitigate 3D chip-stacking thermal impact. In one embodiment, described is an electronic module structure with offset 3D stacked chips and a two-piece lid structure that extracts heat from the bottom and top of the stacked chips, with TIM between the exposed surfaces of the chips and the bottom-lid top surfaces. In another embodiment, described is an electronic module structure with offset 3D stacked chips and a two-piece lid structure that extracts heat from the bottom and top of the stacked chips, with the bottom-lid top surface plated, and where solder bumps from the overhanging chip regions reflow to the plated regions of the bottom-lid top surfaces.

Figure 1:
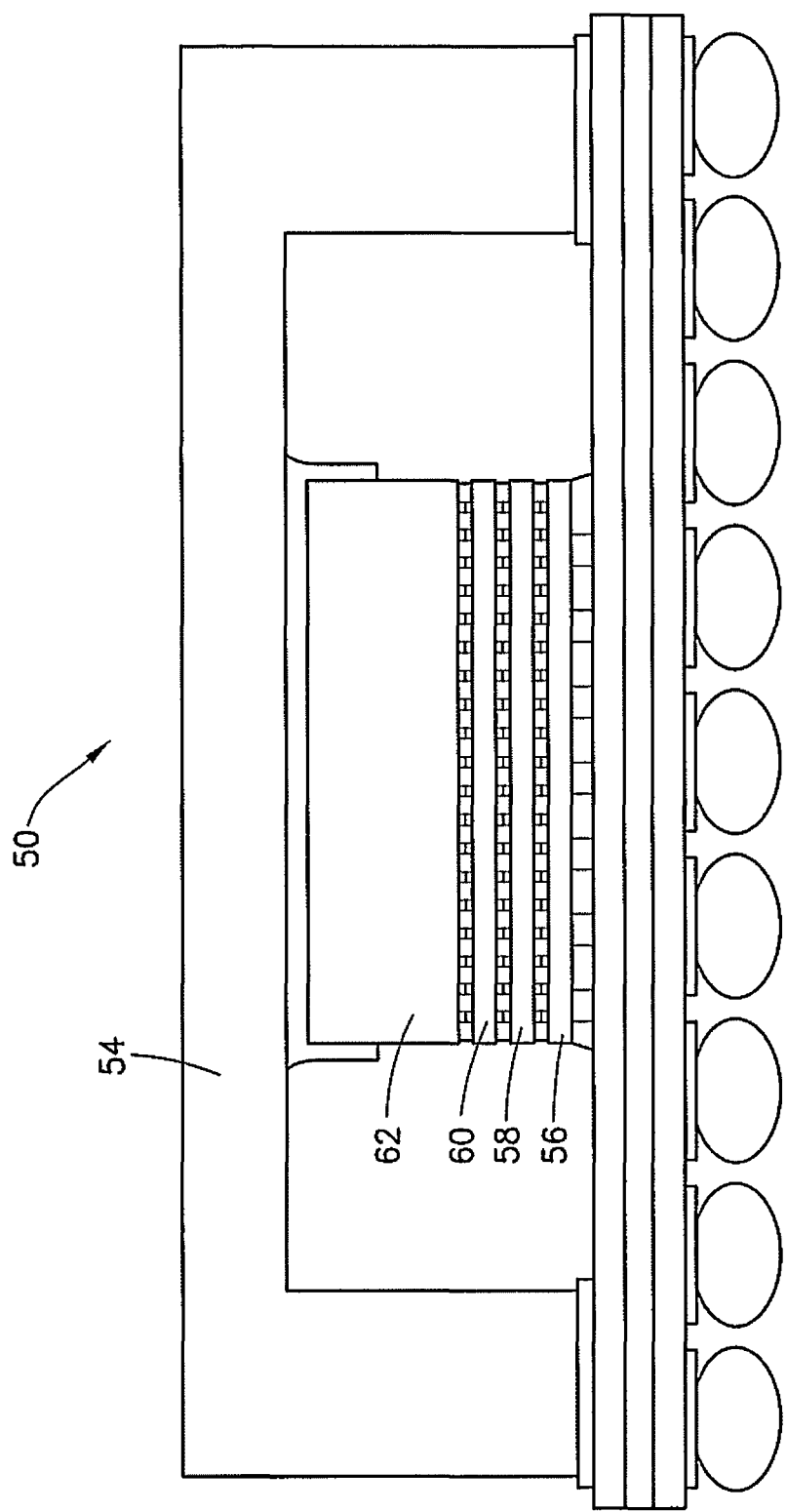
FIG. 1 is a 3D chip stack package where the chips are vertically aligned with a one-piece cooling lid.

FIG. 1 is a 3D chip stack package 50 where the chips (56, 58, 60, 62) are vertically aligned with a one-piece cooling lid (54).

Figure 2:
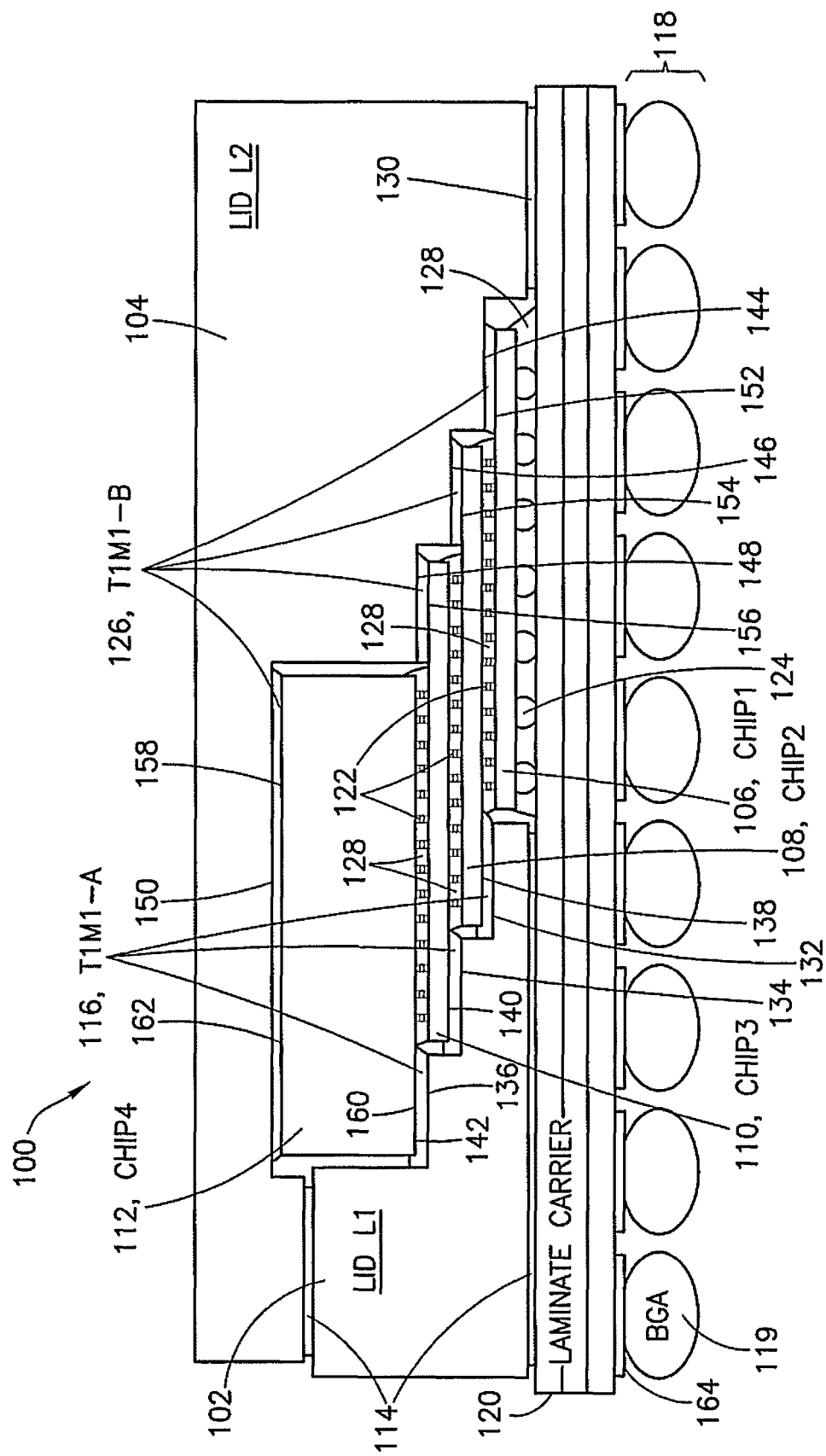
FIG. 2 is a side view of an electronic structure with offset stacked chips with a two-piece cooling lid, the two-piece cooling lid having a top side and a bottom side.

FIG. 2 is a side view of an electronic structure 100 with offset stacked chips, including chip1 106, chip2 108, chip3 110, and chip4 112, with a top side cooling lid (lid L2 104) and bottom side cooling lid (lid L1 102). The lid L1 102 is connected to and mounted onto the laminate carrier 120 via an adhesive or solder 114, and the lid L2 104 is connected to and mounted onto the laminate carrier 120 via an adhesive 130. As can be seen in FIG. 2, the adhesive or solder 114 also couples the lid L1 102 to the Lid L2 104 on the left side of the structure 100. A plurality of controlled collapse chip connections (C4) 124, each separated by a distance, connect the bottom-most chip (chip1 106) to the laminate carrier 120.

A plurality of Cu pillars 122, each separated by a distance, connect chip1 106 to chip2 108. A plurality of Cu pillars 122, each separated by a distance, connect chip2 108 to chip3 110. A plurality of Cu pillars 122, each separated by a distance, connect chip3 110 to chip4 112. On the left side of the structure, there is thermal interface material (TIM, namely TIM1-A 116) between the exposed surfaces (138, 140, 142) of the chips (108, 110, 112) and the bottom-lid (102) ledge top surfaces (132, 134, 136). On the right side of the structure, there is thermal interface material (TIM, namely TIM1-B 126) between the exposed surfaces (152, 154, 156, 158) of the chips (106, 108, 110, 112) and the top-lid (104) ledge bottom surfaces (144, 146, 148, 150).

There is underfill 128 dispensed on the laminate 120 and the open bottom surface of chip1 106, such that the underfill 128 encapsulates the controlled collapse chip connections (C4) 124. There is underfill 128 dispensed on the open top surface of chip1 106 and open bottom surface of chip2 108, such that the underfill 128 encapsulates the plurality of Cu pillars 122. There is underfill 128 dispensed on the open top surface of chip2 108 and open bottom surface of chip3 110, such that the underfill 128 encapsulates the plurality of Cu pillars 122. There is underfill 128 dispensed on the open top surface of chip3 110 and open bottom surface of chip4 112, such that the underfill 128 encapsulates the plurality of Cu pillars 122. As shown in FIG. 2, the laminate carrier 120 is connected to a plurality of ball grid array balls (BGA) 119, where the plurality of BGA balls 119 form a BGA 118, or to a plurality of land grid array (LGA) pads 164.

Thus, described herein is an electronic module structure 100 with unidirectional or bidirectional offset 3D solder-joined stacked chips (106, 108, 110, 112) and a two-piece lid structure (102, 104) that extracts heat from the bottom (e.g. 160) and top (e.g. 162) of the stacked chips (106, 108, 110, 112), with TIM (116) between the exposed surfaces (138, 140, 142) of the chips (108, 110, 112) and the bottom-lid ledge top surfaces (132, 134, 136). The lids (102, 104) may have microchannels (refer e.g. to FIG. 11) to facilitate fluid convection for enhanced cooling. One or more chips (106, 108, 110, 112) in the stack may be hybrid bonded. The offset stacked chips (106, 108, 110, 112) may be wirebonded.

Further described herein is an electronic module structure 100 with multiple overmolded flip chip packages, including the chips (106, 108, 110, 112), C4 124, Cu pillars 122, TIM1-A 116, TIM1-B 126, and underfill 128, where the packages are stacked in a way that the silicon chips (106, 108, 110, 112) are unidirectionally or bidirectionally offset. Through vias (e.g. C4 124 and Cu pillars 122) are fabricated in the aforementioned mold that extracts heat from the stacked chips (106, 108, 110, 112).

Further described herein is a 3D offset stacked electronic chip 100 with embedded micro-coolers in an overmolded structure capable to provide active thermal management. The structure 100 includes multiple embedded microcoolers at each tier to provide lateral cooling.

Figures 3, 3A, 3B:
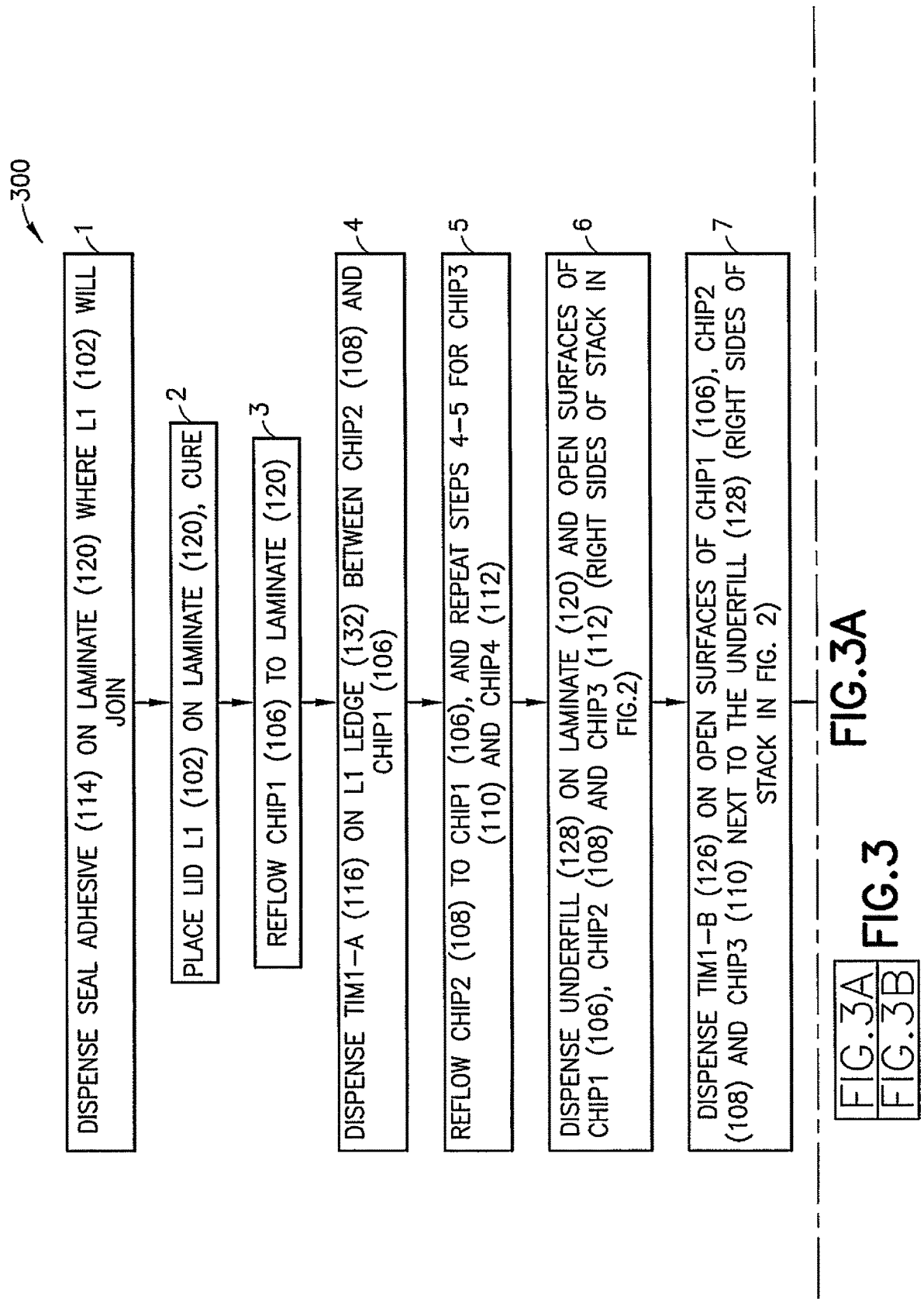
FIG. 3A and FIG. 3B (collectively FIG. 3) is a process flow to fabricate the electronic structure with offset stacked chips with a top and bottom side cooling lid.
Figure 3B:
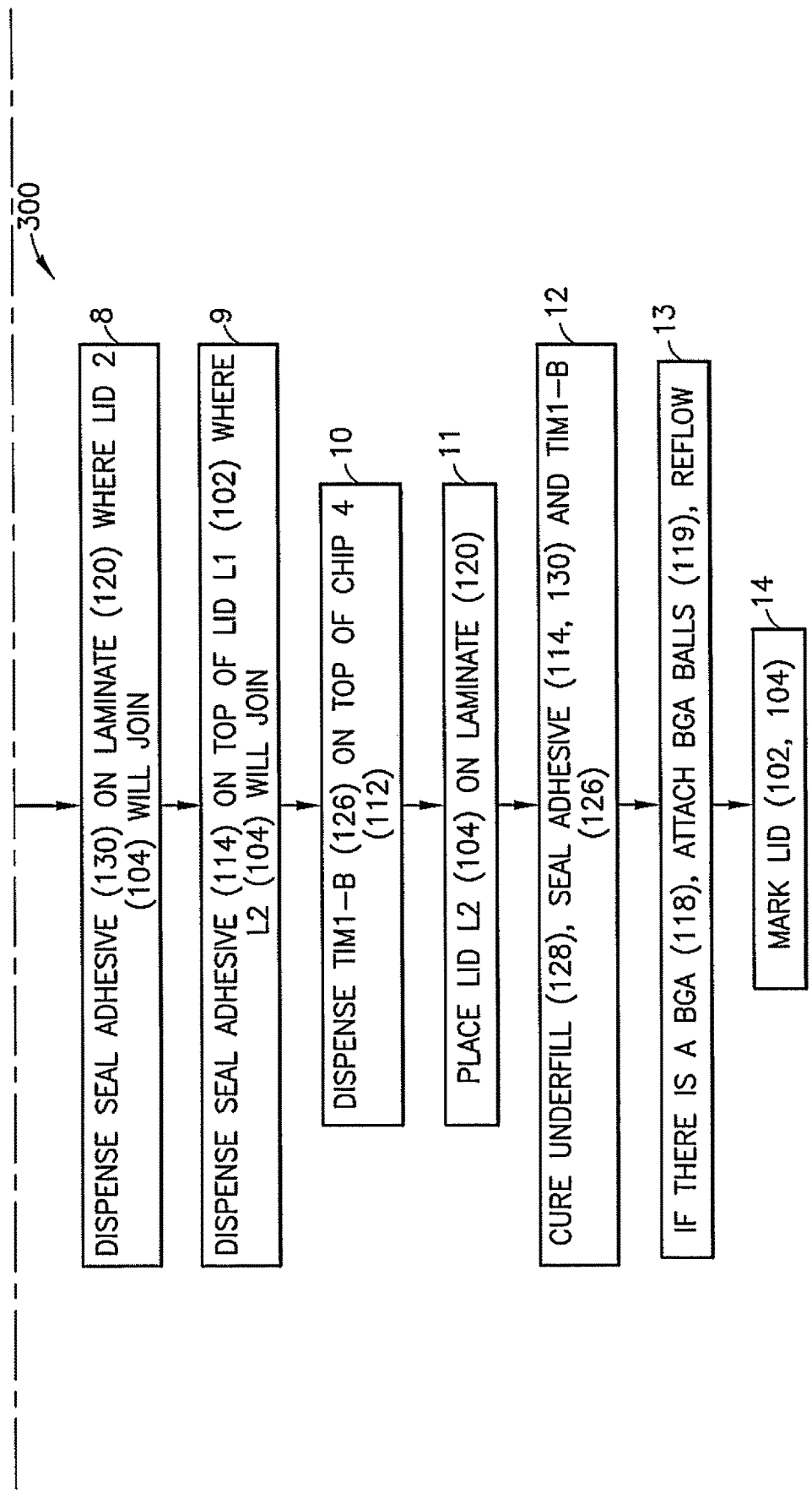

A process flow 300 to fabricate the structure 100 is shown in FIG. 3A and FIG. 3B (collectively FIG. 3) and given as follows: In FIG. 3A, (1) dispense seal adhesive 114 on laminate 120 where L1 102 will join; (2) place lid L1 102 on laminate 120, cure; (3) reflow chip1 106 to laminate 120; (4) dispense TIM1-A 116 on L1 ledge 132 between chip2 108 and chip1 106; (5) reflow chip2 108 to chip1 106, and repeat items 4-5 for chip3 110 and chip4 112; (6) dispense underfill 128 on laminate 120 and open surfaces of chip1 106, chip2 108 and chip3 110 (right sides of stack in FIG. 2); (7) dispense TIM1-B 126 on open surfaces of chip1 106, chip2 108 and chip3 110 next to the underfill 128 (right sides of stack in FIG. 2); In FIG. 3B, (8) dispense seal adhesive 130 on laminate 120 where lid L2 104 will join; (9) dispense seal adhesive 114 on top of lid L1 102 where lid L2 104 will join; (10) dispense TIM1-B 126 on top of chip 4 112; (11) place lid L2 104 on laminate 120; (12) cure underfill 128, seal adhesive (114, 130) and TIM1-B 126; (13) if there is a BGA 118, attach BGA balls 119, reflow; (14) mark lid (102, 104).

Figure 4:
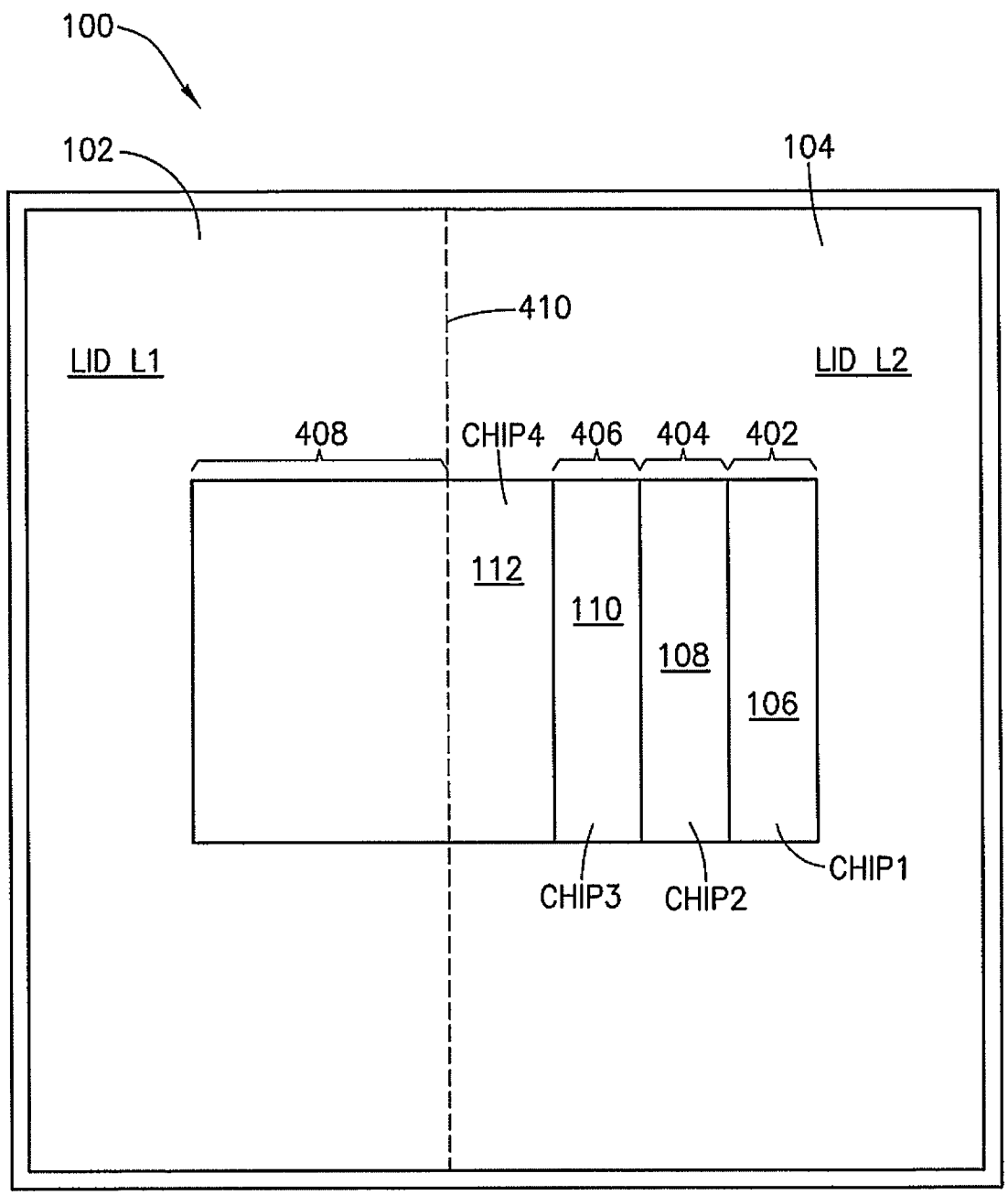
FIG. 4 is a plan view of an electronic package having four (as an example) offset stacked chips with a top and bottom side cooling lid.

FIG. 4 is a plan view of the structure 100 having offset stacked chips (106, 108, 110, 112) with a top side cooling lid 104 and bottom side cooling lid 102. Shown are offsets 402, 404, 406, and 408. Offset 402 is the portion of chip1 106 offset from chip2 108, offset 404 is the portion of chip2 108 offset from chip3 110, offset 406 is the portion of chip3 110 offset from chip4 112, and offset 408 of the portion of chip4 112 offset from chip3 110 in the opposite direction, where item 410 is where chip3 110 terminates on the underside of chip4 112.

Figure 5B:
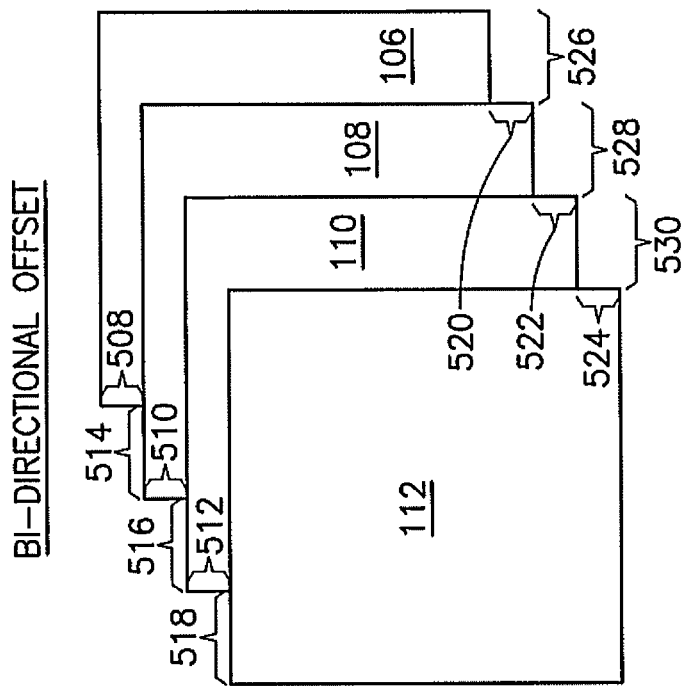
FIG. 5B depicts a bidirectional offset stacked chips configuration.
Figure 5A:
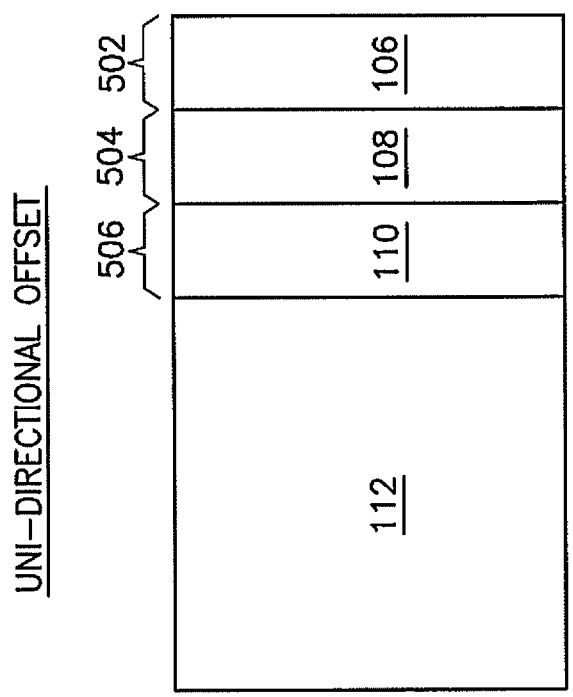
FIG. 5A depicts a unidirectional offset stacked chips configuration.

FIG. 5A depicts a uni-directional offset stacked chips configuration, showing offsets 502, 504, and 506. Offset 502 shows the portion of chip 106 offset from chip 108 in one direction, offset 504 shows the portion of chip 108 offset from chip 110 in the one direction, and offset 506 shows the portion of chip 110 offset from chip 112 in the one direction.

FIG. 5B depicts a bi-directional offset stacked chips configuration, where one direction is downward and the other direction is to the left, or equivalently without loss of generality one direction is upward and the other direction is to the right. At the top of the structure, offset 508 shows the portion of chip 106 offset from chip 108 in the upwards direction, offset 510 shows the portion of chip 108 offset from chip 110 in the upwards direction, and offset 512 shows the portion of chip 110 offset from chip 112 in the upwards direction. Further at the top of the structure, offset 514 shows the portion of chip 108 offset from chip 106 in the left direction, offset 516 shows the portion of the chip 110 offset from chip 108 in the left direction, and offset 518 shows the portion of the chip 112 offset from the chip 110 in the left direction. At the bottom of the structure, offset 520 shows the portion of chip 108 offset from chip 106 in the downwards direction, offset 522 shows the portion of chip 110 offset from chip 108 in the downwards direction, and offset 524 shows the portion of chip 112 offset from chip 110 in the downwards direction. At the bottom of the structure, offset 526 shows the portion of chip 106 offset from chip 108 in the right direction, offset 528 shows the portion of chip 108 offset from chip 110 in the right direction, and offset 530 shows the portion of chip 110 offset from chip 112 in the right direction.

Figure 5C:
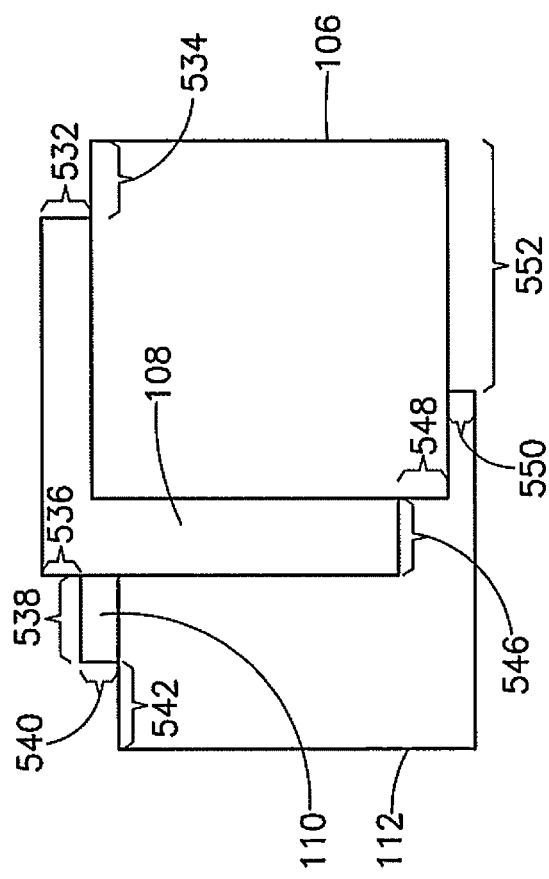
FIG. 5C depicts a multi-directional offset stacked chips configuration (to uncover cores from above)

FIG. 5C depicts a multi-directional offset stacked chips configuration (to uncover cores from above). The various directions include top, bottom, left, and right (although in other embodiments offsets along any portion of a 360° plane may be implemented). Offset 534 shows the portion of chip 106 offset from chip 108 to the right, offset 538 shows the portion of chip 110 offset from chip 108 to the left, offset 542 shows the portion of chip 112 offset from chip 110 to the left, offset 546 shows the portion of chip 108 offset from chip 106 to the left, and offset 552 shows the portion of chip 106 offset from chip 112 to the right. Offset 532 shows the portion of chip 108 offset from chip 106 in the upward direction, offset 536 shows the portion of chip 108 offset from chip 110 in the upward direction, offset 540 shows the portion of chip 112 offset from chip 110 in the downward direction, offset 548 shows the portion of chip 106 offset from chip 108 in the downward direction, and offset 550 shows the portion of chip 112 offset from chip 106 in the downward direction.

Figure 6:
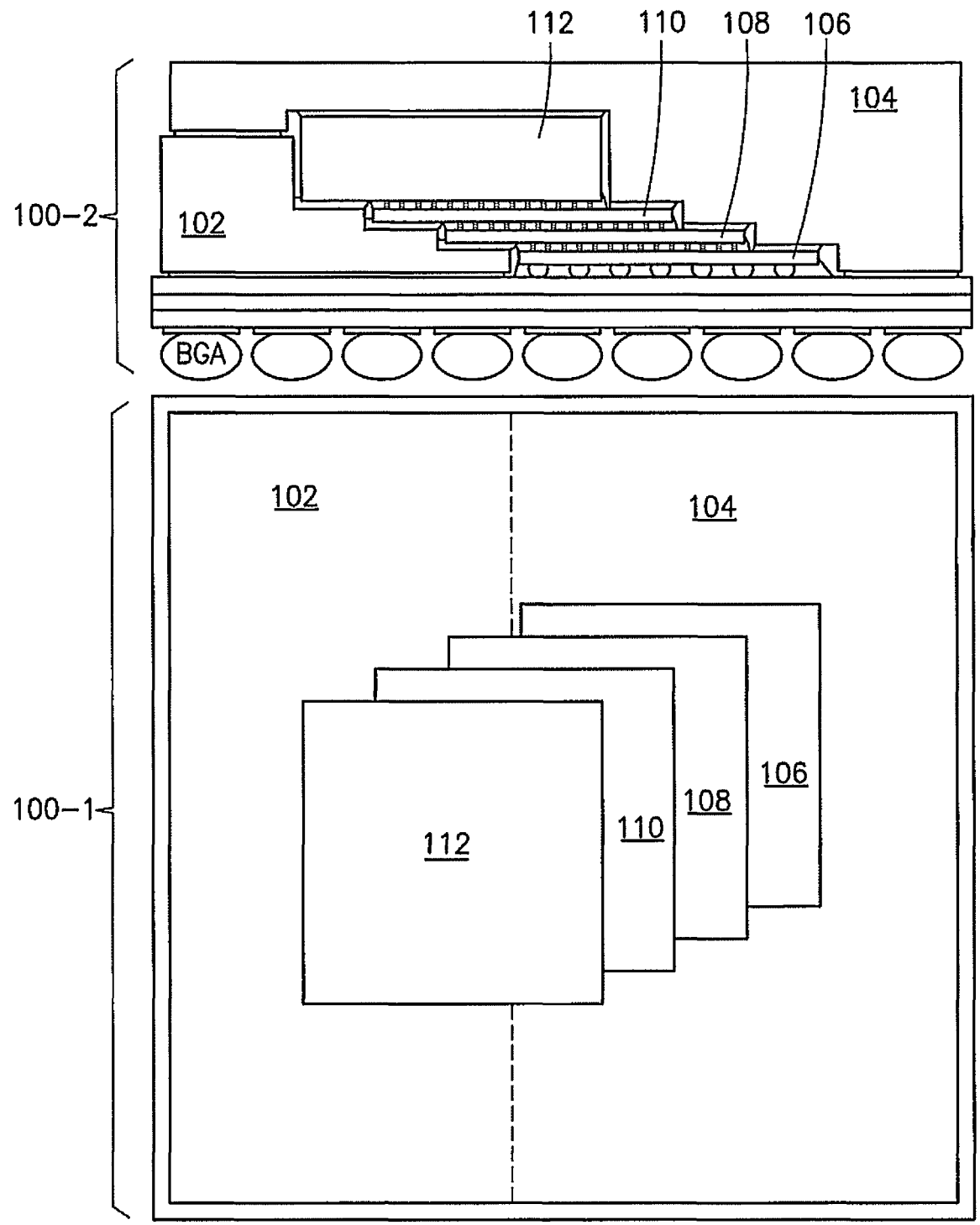
FIG. 6 is a plan view of an electronic package having bidirectional offset stacked chips of a with a top and bottom side cooling lid, together with a side view of the electronic structure.

FIG. 6 is a plan view (100-1) of the structure having bidirectional offset stacked chips (106, 108, 110, 112) with a top side cooling lid 104 and bottom side cooling lid 102, together with a side view (100-2) of the structure.

Figure 7:
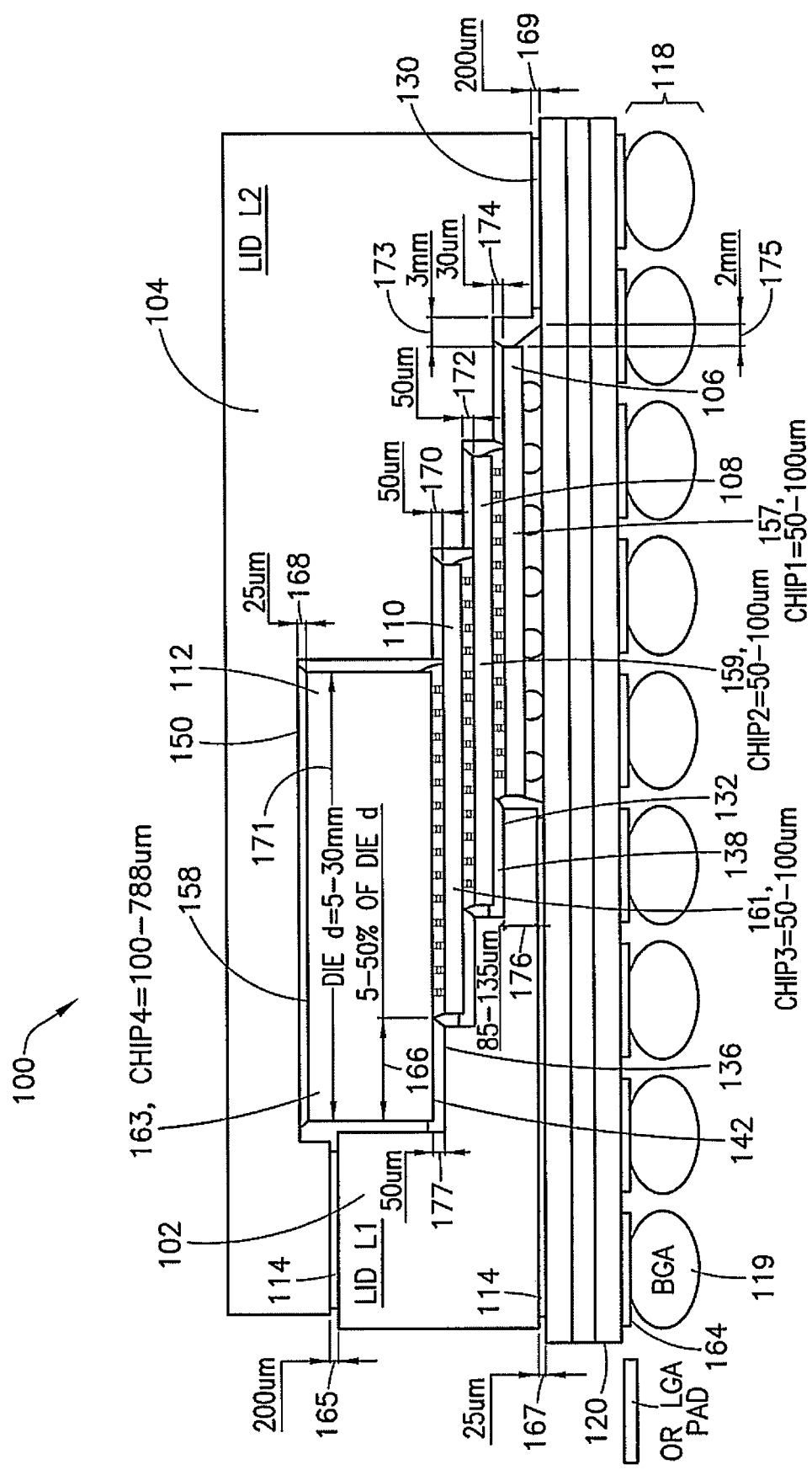
FIG. 7 is a side view of the offset 3D stack package with a two-sided cooling lid, showing exemplary dimensions.

FIG. 7 is a side view of the offset 3D stack package 100 with a two-sided cooling lid (102, 104), showing exemplary dimensions. Chip1 106 has a height between 50-100 um (157), chip2 108 has a height between 50-100 um (159), chip3 110 has a height between 50-100 um (161), and chip4 112 has a height between 100-788 um (163). At 165, the space between the top side of lid L1 102 and the bottom side of lid L2 104 where lid L1 102 joins lid L2 104 with the adhesive or solder 114 is approximately 200 um. At 167, the space between the top surface of the laminate 120 and the bottom surface of the lid L1 102 where lid L1 102 joins the laminate 120 with the adhesive or solder 114 is approximately 25 um. At 169, the space between the top surface of the laminate 120 and the bottom surface of the lid L2 104 where the lid L2 104 joins the laminate 120 with adhesive 130 is approximately 200 um.

At for example 171, the length of a die is between 5-30 mm, where a die is a chip with one or more embedded components, or one or chip1 106, chip2 108, chip3 110, or chip4 112 with one or more embedded components. As shown at 166, between 5%-50% of the length of a die is offset from another die, for example 5%-50% of the length of chip4 112 is offset to the left from the end of chip3 110.

At 168, the space between the exposed top surface 158 of chip4 112 and the ledge bottom surface 150 of lid L2 104 where the TIM1-B 126 is applied is approximately 25 um. At 170, the space between the exposed top surface of chip3 110 and the ledge bottom surface of lid L2 104 where the TIM1-B 126 is applied is approximately 50 um. At 172, the space between the exposed top surface of chip2 108 and the ledge bottom surface of lid L2 104 where the TIM1-B 126 is applied is approximately 50 um. At 174, the space between the exposed top surface of chip1 106 and the ledge bottom surface of lid L2 104 where the TIM1-B 126 is applied is approximately 30 um.

At 173, the space between the rightmost edge of chip1 106 the side of lid L2 104 covering the rightmost edge of chip1 106 is approximately 3 mm. At 175, the distance between the rightmost edge of chip1 106 and where the underfill 128 terminates along the surface of the laminate 120 is approximately 2 mm. At 176, the distance between the ledge top surface 132 of the lid L1 102 under the exposed surface 138 of chip2 108 and the bottom surface of the lid L1 102 just above the laminate 120 is between 85 um-135 um. At 177, the distance between the ledge top surface 136 of the lid L1 102 under the exposed surface 142 of chip4 112 to the exposed surface 142 of chip4 112 is approximately 50 um.

Figure 8:
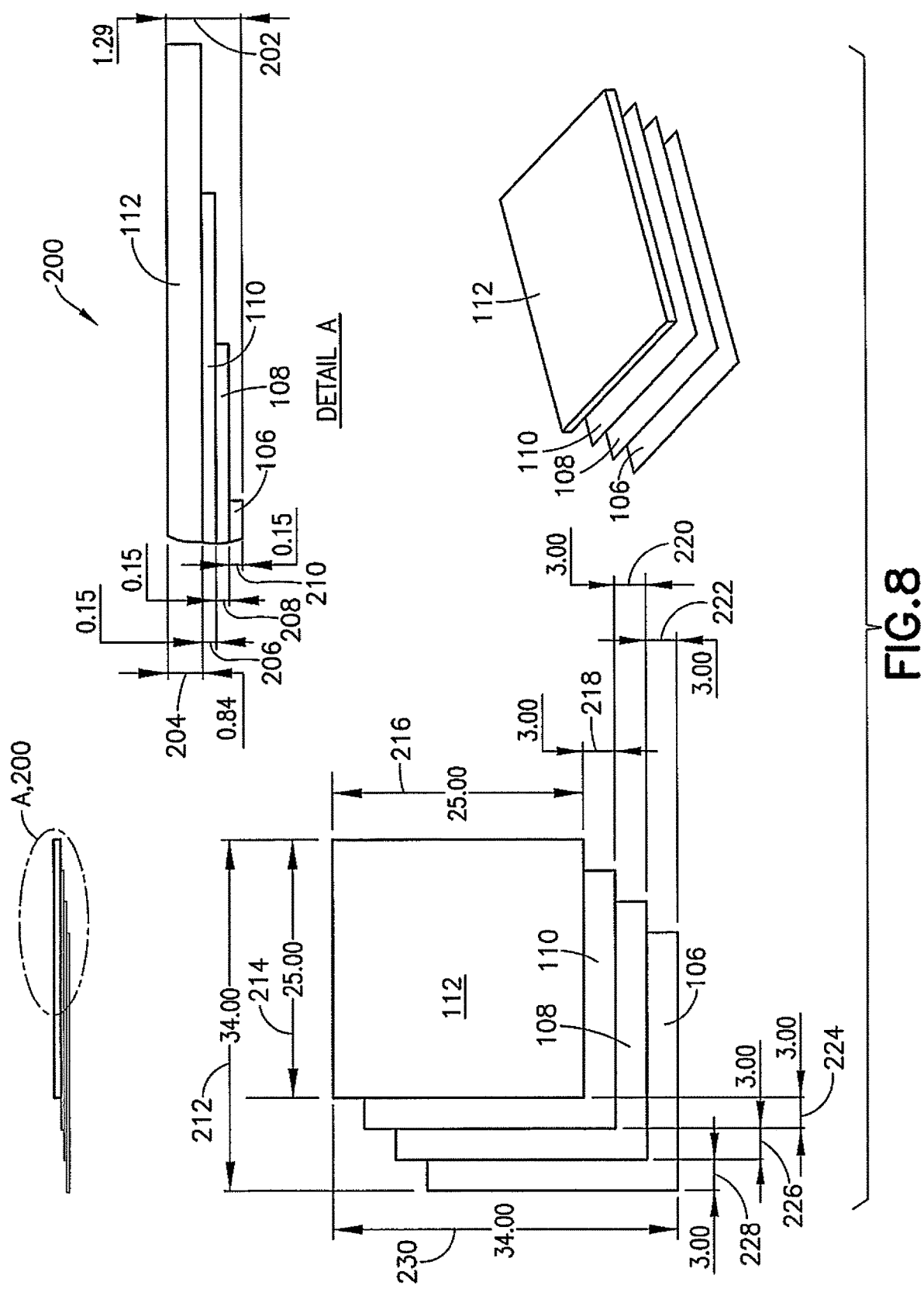
FIG. 8 depicts exemplary dimensions of the chip stack including the offset chips.

FIG. 8 depicts dimensions of the chip stack including the offset chips. Shown in FIG. 8 is detail A 200 on a scale of 10:1. The detail 200 shows that the height of the stacked chips is 1.29 mm (202), including a 0.84 mm height (204) of chip4 112, a 0.15 mm height (206) of chip3 110, a 0.15 mm height (208) of chip2 108, and a 0.15 mm height (210) of chip1 106.

As further shown in FIG. 8, for the bidirectionally offset chip stack on the left, the length (212) of the offset chip stack is 34.00 mm, from the leftmost edge of chip 106 to the rightmost edge of chip 112 (including the lengths of the chips and the offset distances). The width (230) of the offset chip stack is 34.00 mm, from the topmost edge of the chip 112 to the bottommost edge of chip 106 (including the widths of the chips and the offset distances). The length (214) of chip 112 is 25.00 mm, as may be the length of the other chips (106, 108, 110). The width (216) of chip 112 is 25.00 mm, as may be the width of the other chips (106, 108, 110).

FIG. 8 shows a bidirectional offset configuration similar to that shown in FIG. 5B. The offset distance (218) of 3.00 mm shows the portion of chip 110 offset from chip 112 in the downward direction, the offset distance (220) of 3.00 mm shows the portion of chip 108 offset from chip 110 in the downward direction, and the offset distance (222) of 3.00 mm shows the portion of chip 106 offset from chip 108 in the downward direction. The offset distance (224) of 3.00 mm shows the portion of chip 110 offset from chip 112 in the leftward direction, the offset distance (226) of 3.00 mm shows the portion of chip 108 offset from chip 110 in the leftward direction, and the offset distance (228) of 3.00 mm shows the portion of chip 106 offset from chip 108 in the leftward direction.

Figure 9A:
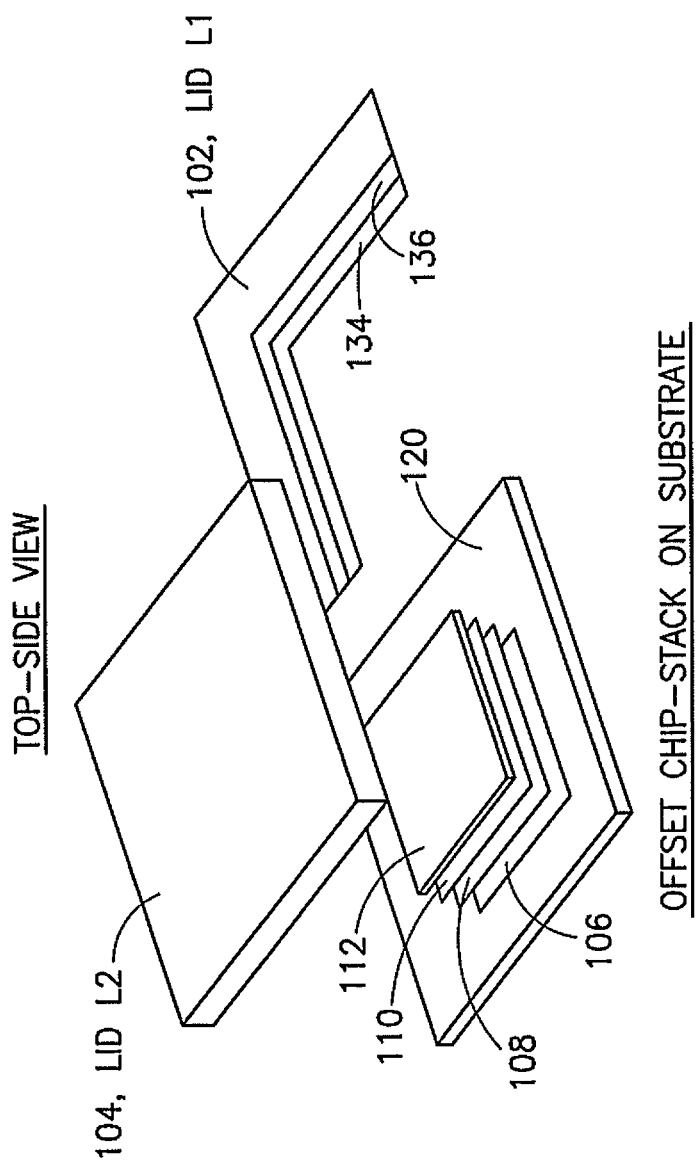
FIG. 9A is an isometric view of the offset chip stack on a substrate.
Figure 9B:
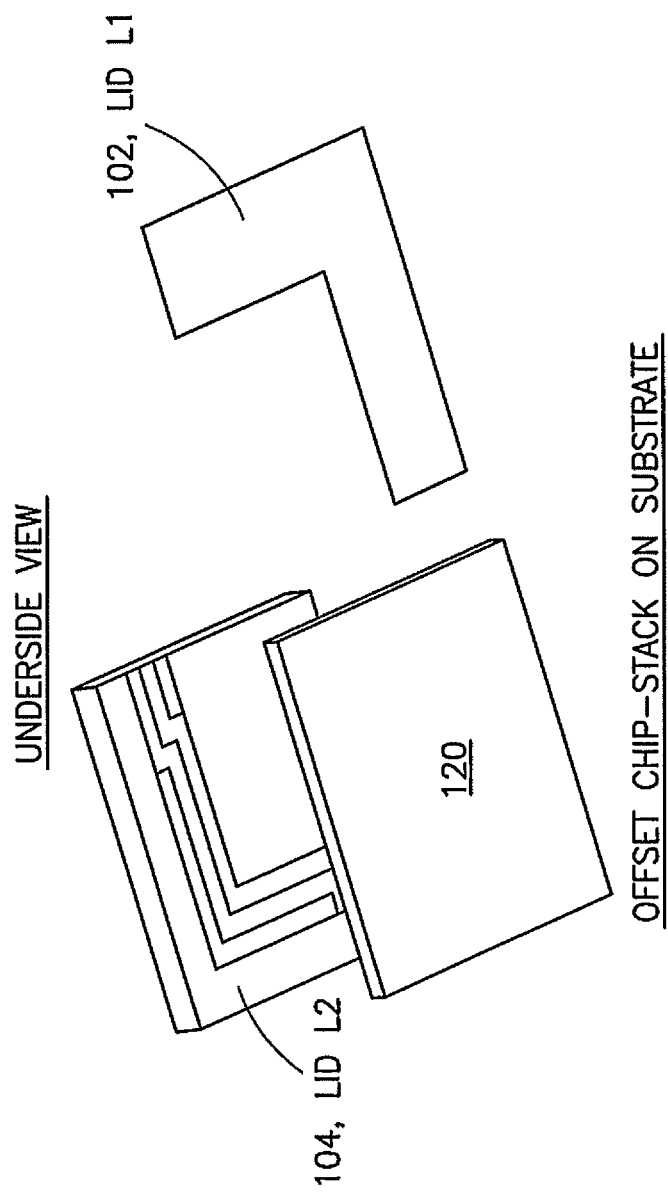
FIG. 9B is an underside isometric view of the offset chip stack on the substrate.

FIG. 9A is an isometric view of the offset chip stack on a substrate 120 (with dimensions corresponding to those as shown in FIG. 8). The lid L1 102 is patterned such that its ledge top surfaces (134, 136) are of a size corresponding to the offsets of the stack comprising the chips (106, 108, 110, 112). FIG. 9B is an underside isometric view of the offset chip stack on the substrate (with dimensions corresponding to those as shown in FIG. 8)).

Figure 10B:
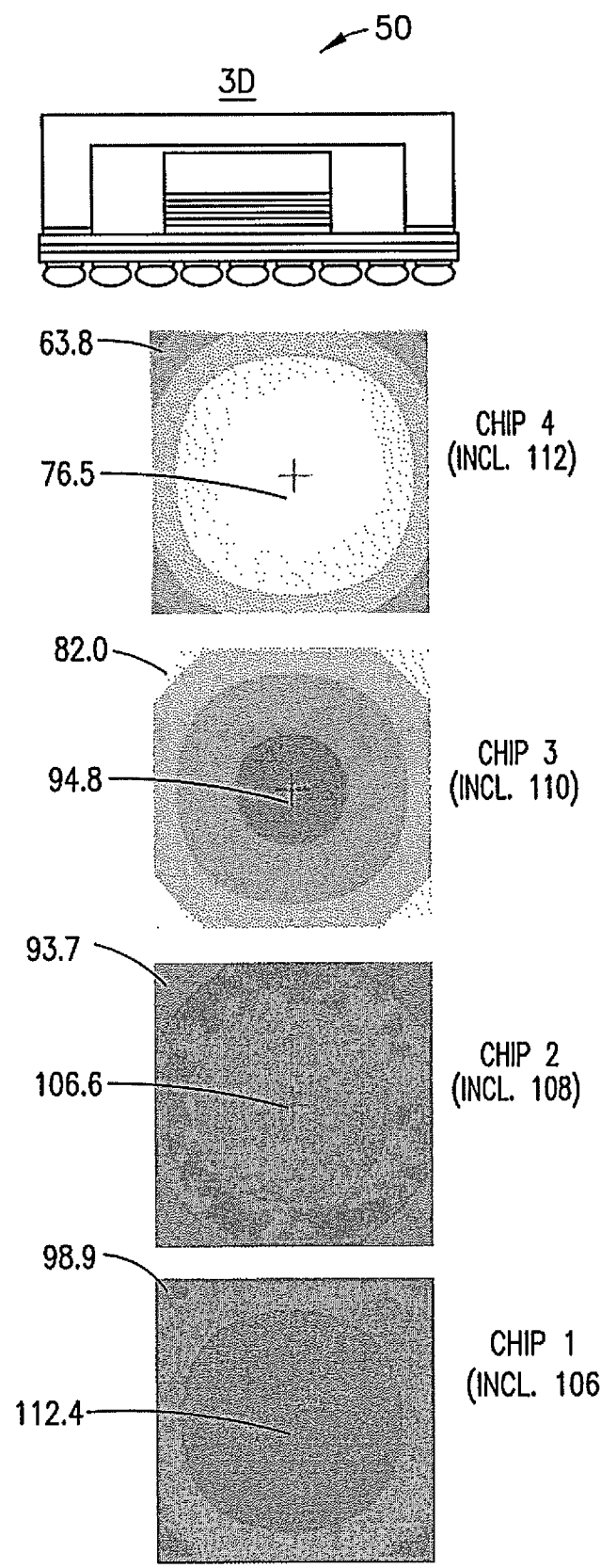
Figure 10C:
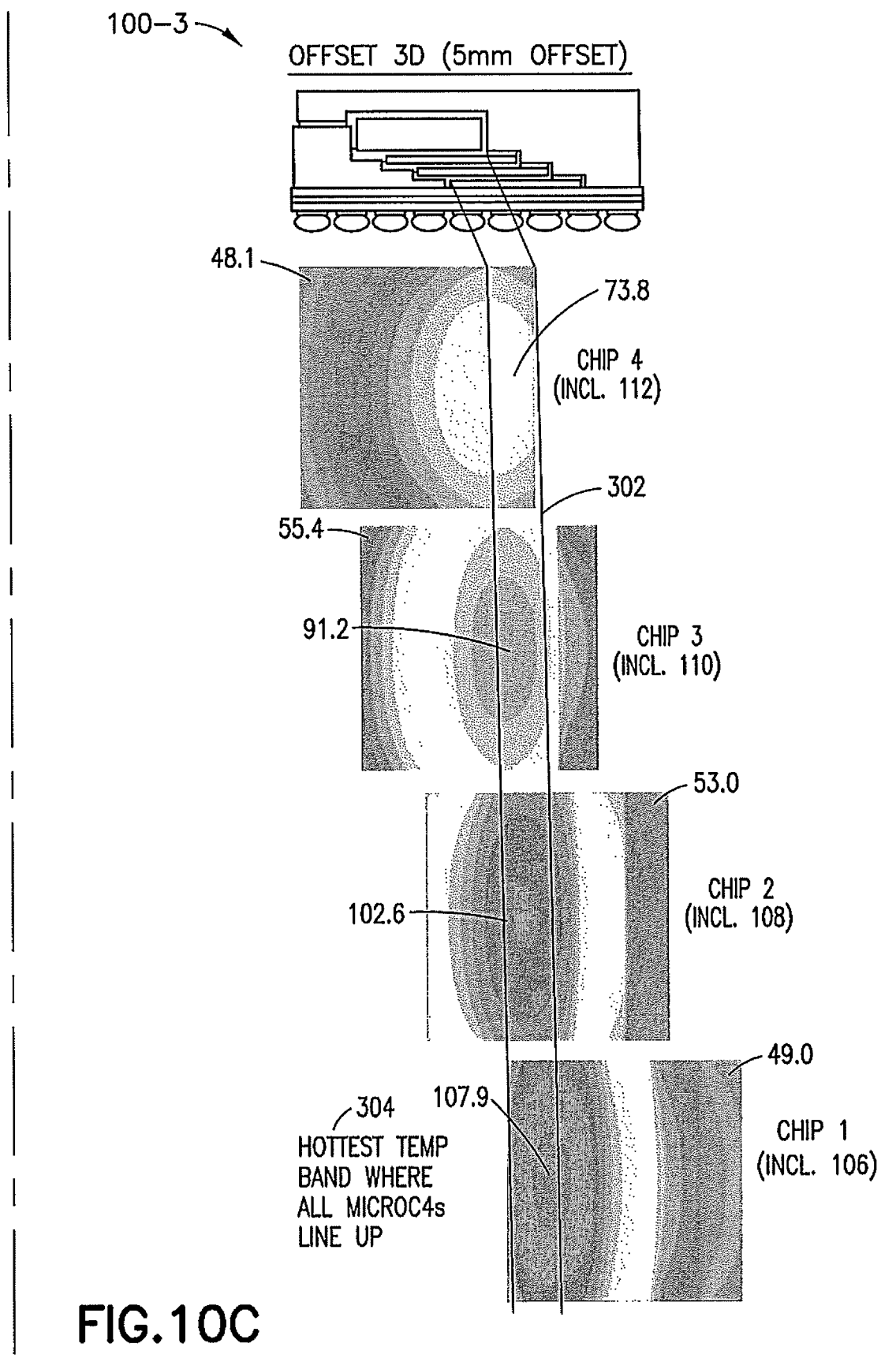
Figure 10D:
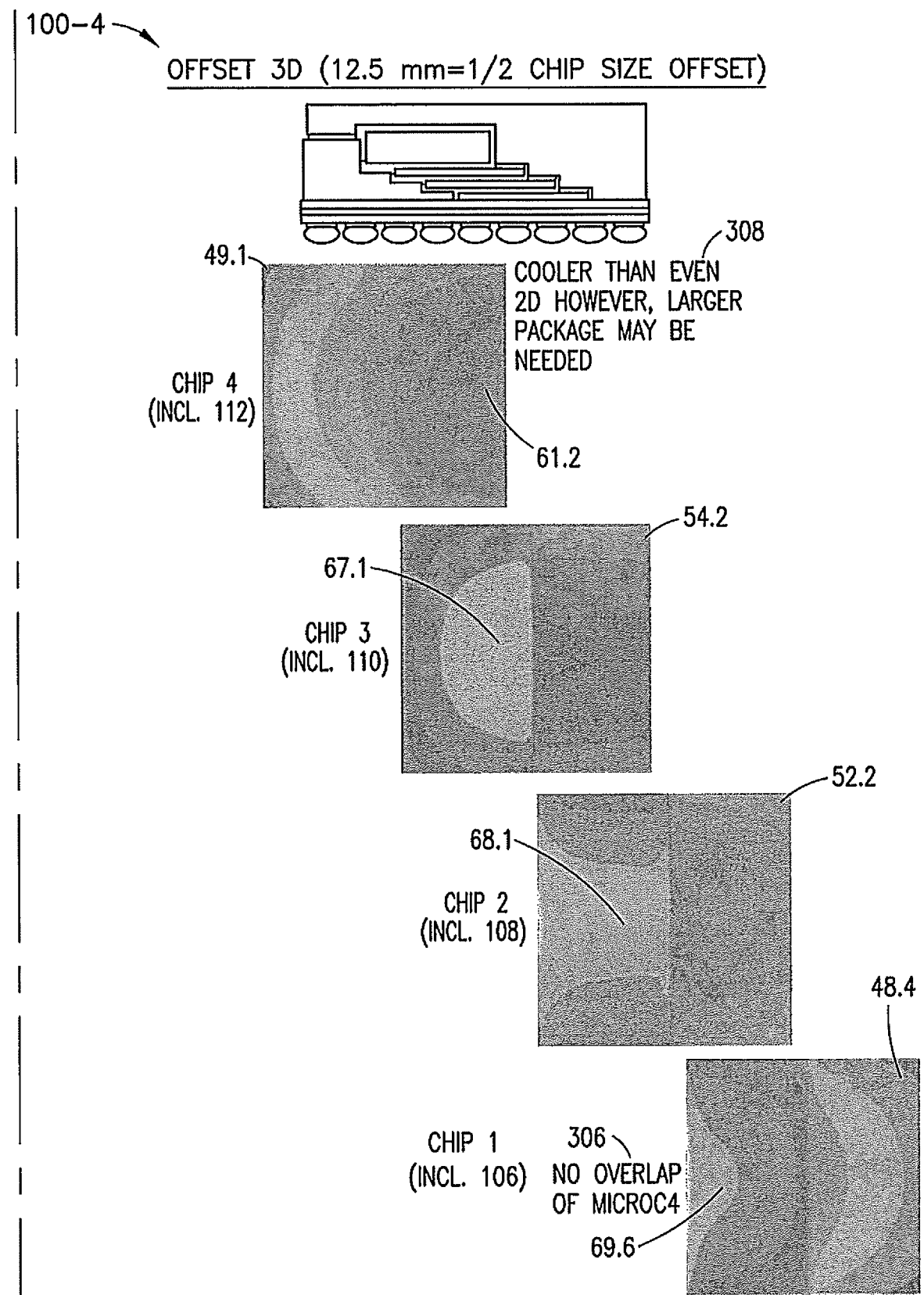

FIG. 10 illustrates enhanced cooling of the structure having offset stacked chips with a top and bottom side cooling lid. FIG. 10 shows the cooling of a 2D structure 25 with one chip, a 3D structure 50 with multiple chips that are not offset, an offset 3D structure 100-3 with a multiple chip 5 mm offset, and an offset 3D structure 100-4 with a multiple chip 12.5 mm offset, where the 12.5 mm offset size is one-half (½) the chip size, where the chip is 25 mm long by 25 mm wide. In the experiment, the laminate is of dimensions 68.5 mm long by 68.5 mm wide, the total chip power is 500 W, cooling was done as a rate of 50000 W/m²K efficiency indicative of a water cooled cold plate, and where the ambient temperature (Ta) was equal to 43 C.

As shown in FIG. 10, the offset 3D stack (5 mm offset) 100-3 and the offset 3D stack (12.5 mm offset) 100-4 cool with better performance than the 3D stack 50. Band 302 shows the temperatures where the micro C4s (124) line up. Thus reference 304 shows that the hottest temperatures are where the micro C4s (124) line up. As indicated at 308, the 3D offset package 100-4 with a 12.5 mm offset becomes cooler than even the 2D package 25, although a larger package may be needed. The offset 3D package 100-4 is able to be cooled well because, as indicated at 306, there is no overlap of micro C4s (124).

Figure 11:
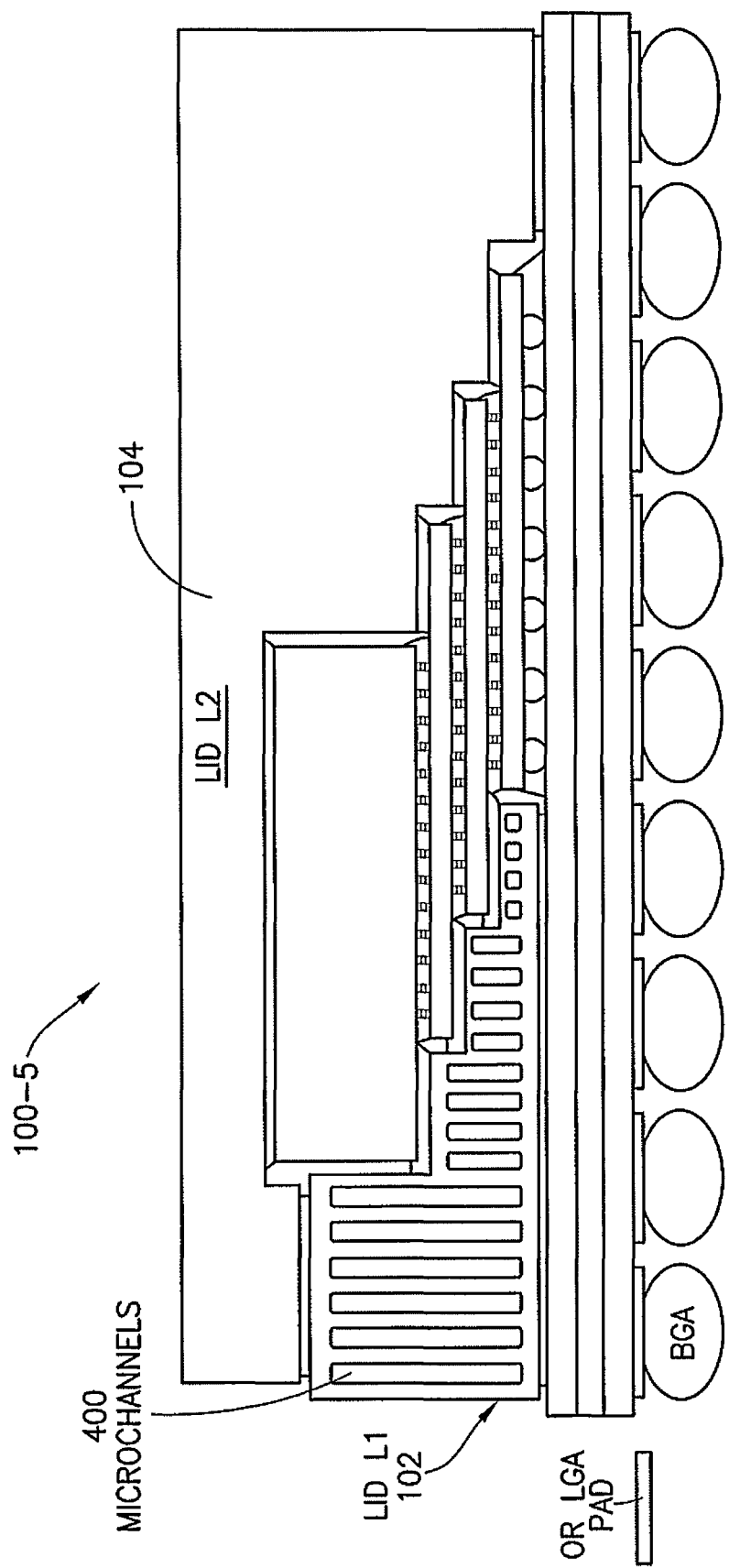
FIG. 11 is a side view of the structure having offset stacked chips having L1 and/or L2 lids with microchannels.

FIG. 11 is a side view of another embodiment of the 3D offset stack chip structure 100-5 with a plurality of microchannels 400 within lid L1 102. The plurality of microchannels 400 may be included within one of the lids (102, 104) or both of the lids (102, 104). Accordingly, the microchannels 400 can be created in lids L1 102 and L2 104 for cooling fluid convection.

Figure 12:
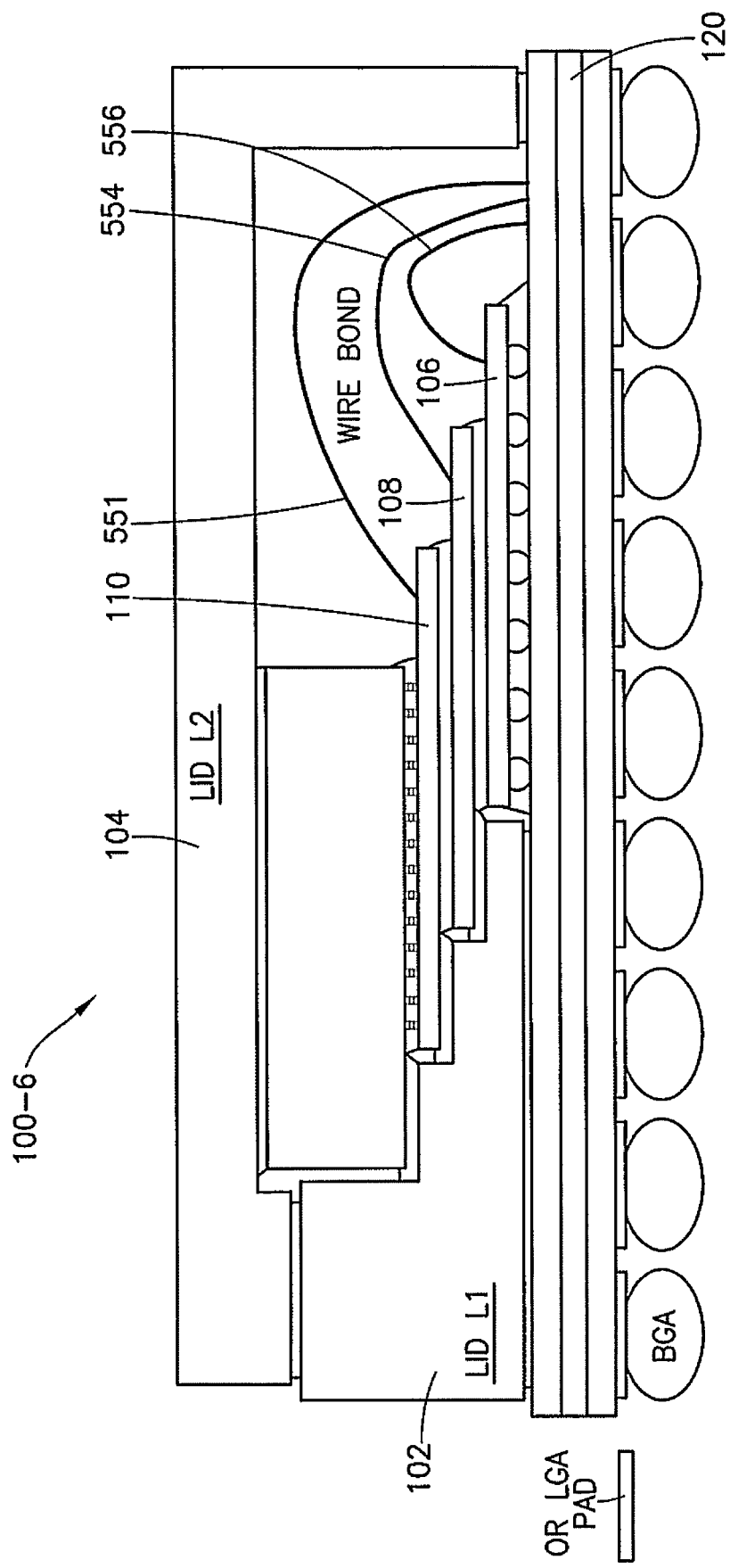
FIG. 12 is a side view of a flip-chip and wirebond implementation of the structure having offset stacked chips with a top and bottom side cooling lid.
Figure 13:
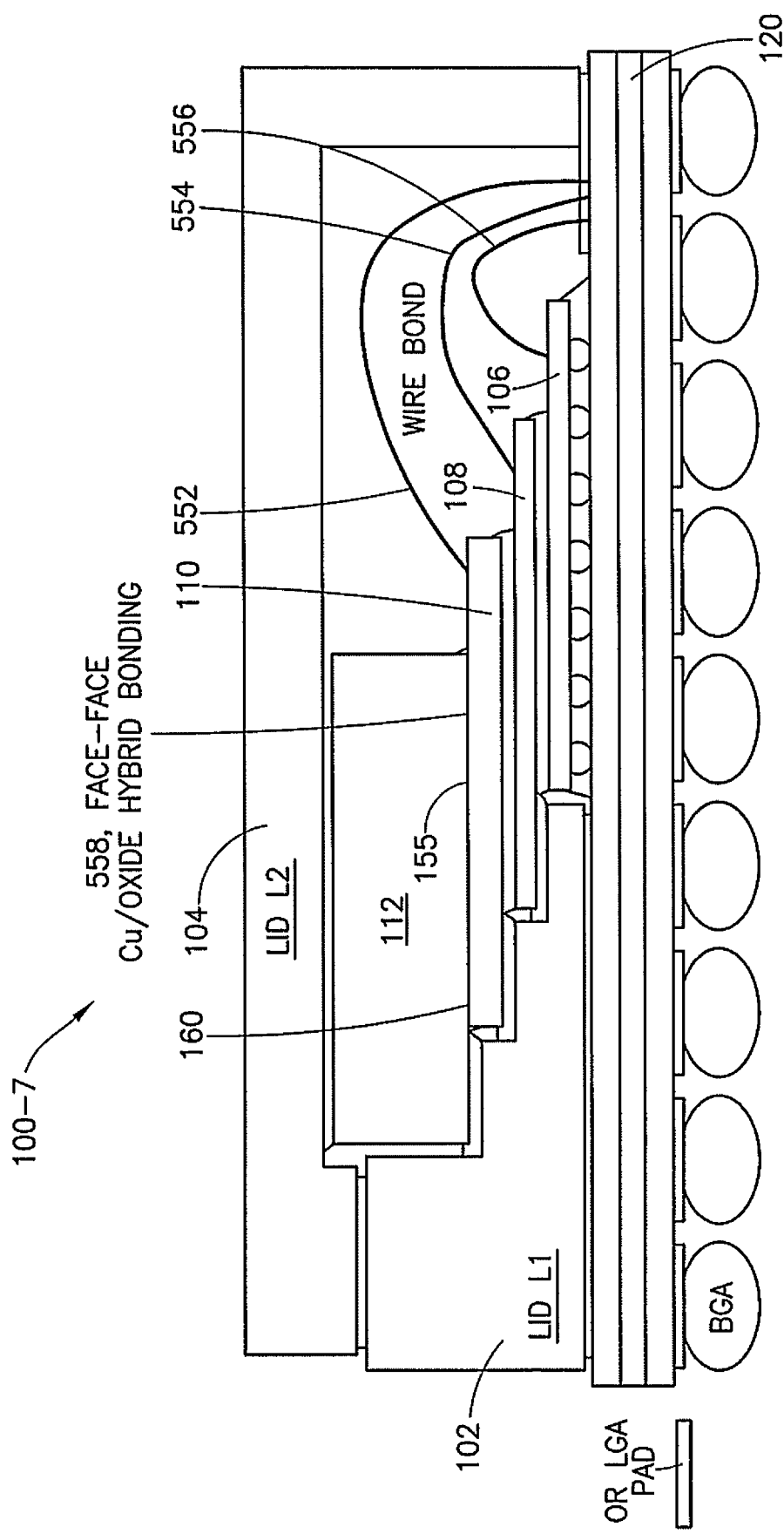
FIG. 13 is a side view of a flip-chip with hybrid bonding and wirebond implementation of the structure having offset stacked chips with a top and bottom side cooling lid.

FIG. 12 is a side view of an embodiment of the flip-chip 100-6 having offset stacked chips with a top and bottom side cooling lid with a wirebond implementation. As shown in FIG. 12, wirebond 551 connects chip 110 to the laminate 120, wirebond 554 connects chip 108 to the laminate 120, and wirebond 556 connects chip 106 to the laminate 120. The wirebonding is done in place of, for example, use of the TIM1-B 126. FIG. 13 is a side view of a flip-chip 100-7 having offset stacked chips with a top and bottom side cooling lid with a hybrid bonding and wirebond implementation. As shown in FIG. 13, there is face-to-face Cu/oxide hybrid bonding 558 between the bottom surface 160 of chip 112 and the top surface 155 of chip 110. The hybrid bonding 558 is done to join the chips (112, 110) rather than, for example, using the Cu pillars 122 and the underfill 128. The Cu pillars 122 and/or the underfill 128 may still be used to join chip 108 to chip 106 and chip 106 to the laminate 120.

Figure 14A:
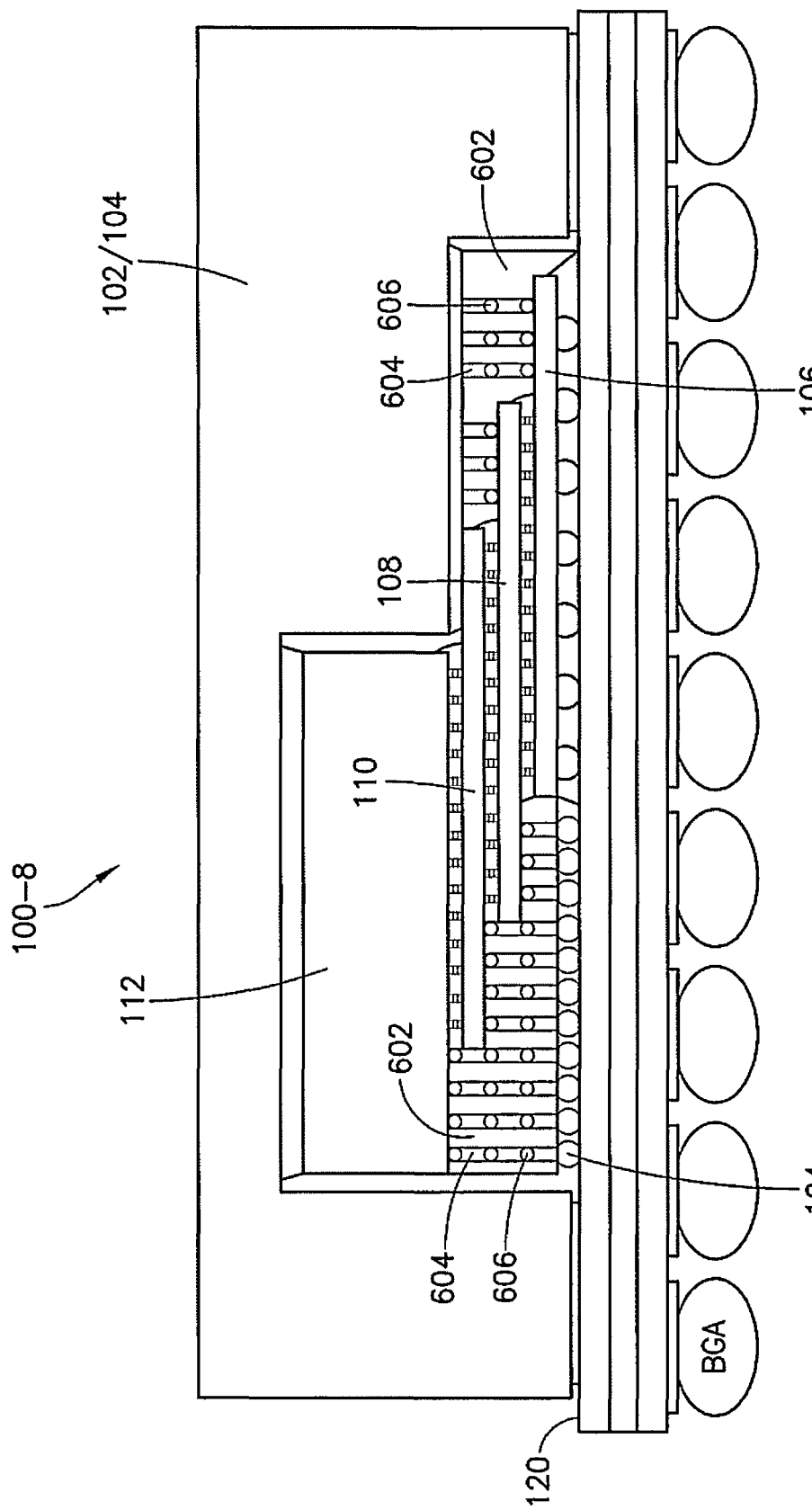
FIG. 14A is a side view of a structure having offset stacked chips with a top and bottom side cooling lid fabricated as a result of an overmold and die thinning process.
Figure 14B:
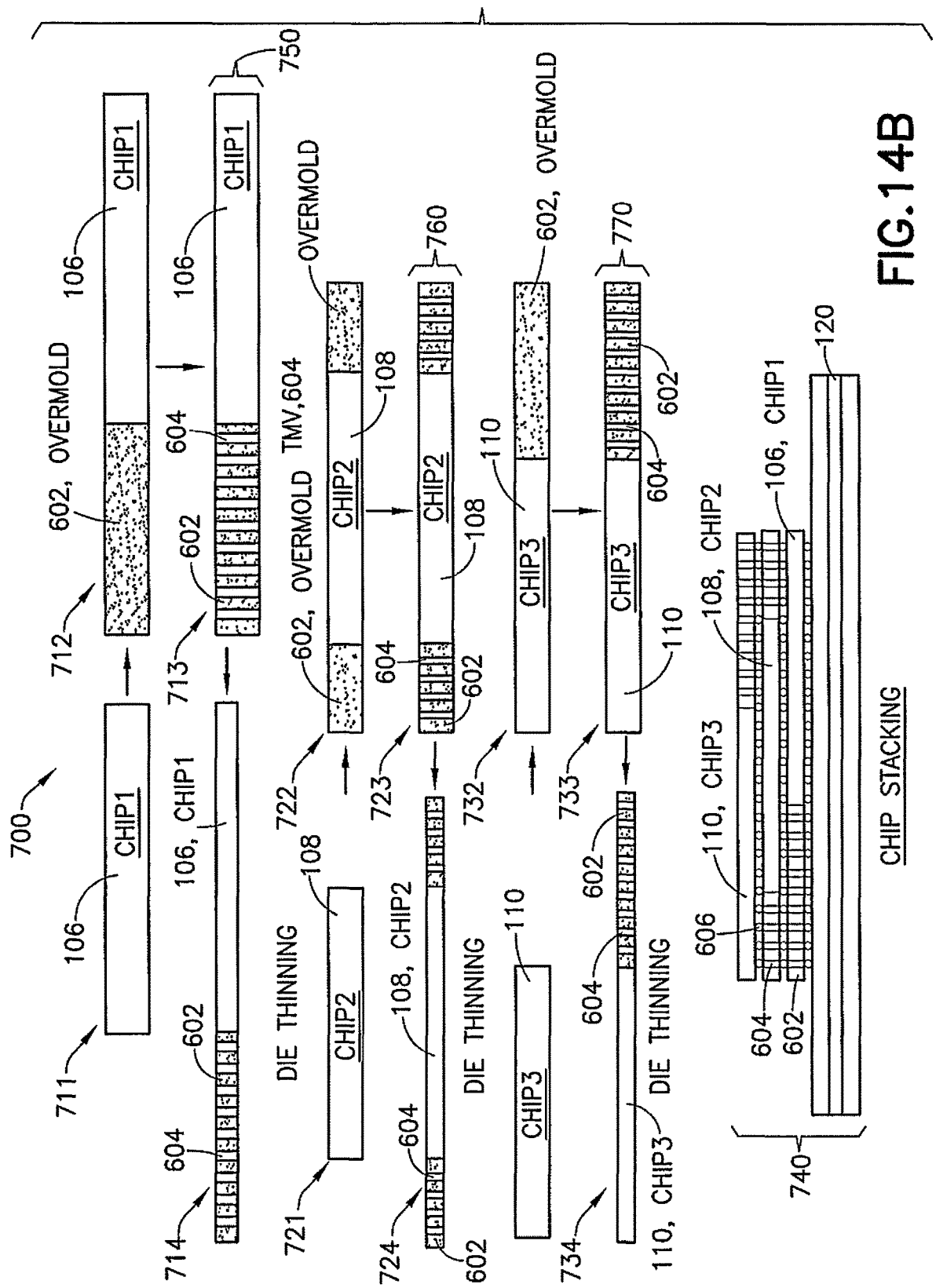
FIG. 14B illustrates an overmold and die thinning process to fabricate the structure shown in FIG. 14A having offset stacked chips with a top and bottom side cooling lid.

FIG. 14A is a side view of a structure 100-8 having offset stacked chips with a top and bottom side cooling lid fabricated as a result of an overmold and die thinning process. Shown in FIG. 14A is an overmold 602 and a plurality of through vias 604 or through mold vias (TMVs) 604 which connect the chips (108, 110, 112) to the laminate 120 on the left side of the structure 100-8, and which connect the chips (106, 108) to the lid (e.g. lid 104) on the right side of the structure 100-8. The plurality of through vias 604 comprise a plurality of connecting elements 606, that connect portions of the through vias 604, as the through vias 604 are fabricated per chip prior to stacking, as is shown in FIG. 14B. On the left side of the structure 100-8, the overmold 602 and the through vias 604 are connected to the laminate 120 with a plurality of C4 elements 124 or connecting elements 606.

FIG. 14B illustrates an overmold and die thinning process 700 to fabricate the structure shown in FIG. 14A having offset stacked chips with a top and bottom side cooling lid. At 711, chip1 106 is fabricated. At 712, an overmold 602 is applied to the left side of chip1 106. At 713, a plurality of connecting through vias 604 are fabricated within the overmold 602. A plurality of connecting elements 606 may also be applied to one side or both sides of the die 750. At 714, the die 750 is thinned, where the die 750 includes the thinned chip1 106, overmold 602, and plurality of through vias 604 as shown. At 721, chip2 108 is fabricated. At 722, an overmold 602 is applied to the left side and right side of chip2 108. At 723, a plurality of through vias 604 are fabricated within the overmold 602. A plurality of connecting elements 606 may also be applied to one side or both sides of the die 760. At 724, the die 760 is thinned, where the die 760 includes the thinned chip2 108, overmold 602, and plurality of through vias 604 as shown. At 731, chip3 110 is fabricated. At 732, an overmold 602 is applied to the right side of chip3 108. At 733, a plurality of connecting through vias 604 are fabricated within the overmold 602. A plurality of connecting elements 606 may also be applied to one side or both sides of the die 770. At 734, the die 770 is thinned, where the die 770 includes the thinned chip3 110, overmold 602, and plurality of through vias 604 as shown. At 740, the chips (106, 108, 110) are stacked together and onto the laminate 120, as shown, where chip 106 is offset from chip2 108 which is offset from chip3 110, and used as part of the structure 100-8 as shown in FIG. 14A.

Figure 15A:
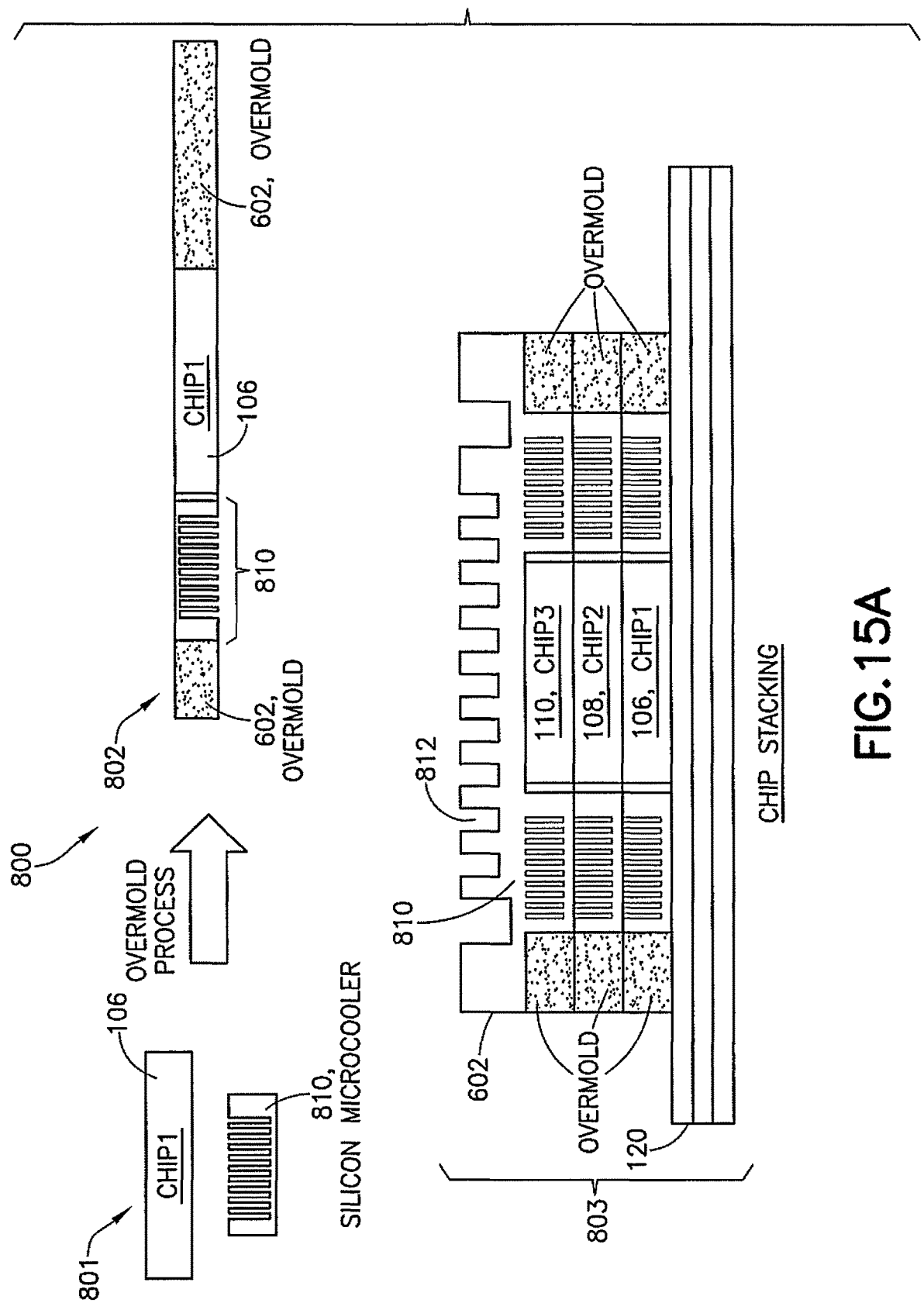
FIG. 15A shows a process to fabricate an embedded microcooler 3D chip stack.

FIG. 15A shows a process 800 to fabricate an embedded microcooler 3D chip stack. In process 800, the chips are not offset. At 801, a plurality of chips, including chip1 106 are fabricated, and a plurality of silicon microcoolers 810 are fabricated. At 802, the microcoolers 810 are joined to one or both sides of the chips, and an overmold 602 is then applied on one or both sides of the resulting structure. For example, as shown in FIG. 15A, microcoolers 810 are applied to the left and right sides of each of the chips (106, 108, 110), followed by an overmold 602 being applied to the left and right sides of the resulting structure. As shown in FIG. 15A, the microcoolers applied on both sides of the chips are of substantially similar size, and the microcoolers applied to each of the chips are of substantially similar size (e.g. the microcoolers 810 applied on both sides of chip1 are substantially similar in size to the microcoolers 810 applied on both sides of chip2). At 803, the chips (106, 108, 110) are stacked onto the laminate 120, as shown. Etches 812 are also fabricated into the stack for further layering of material.

Figure 15B:
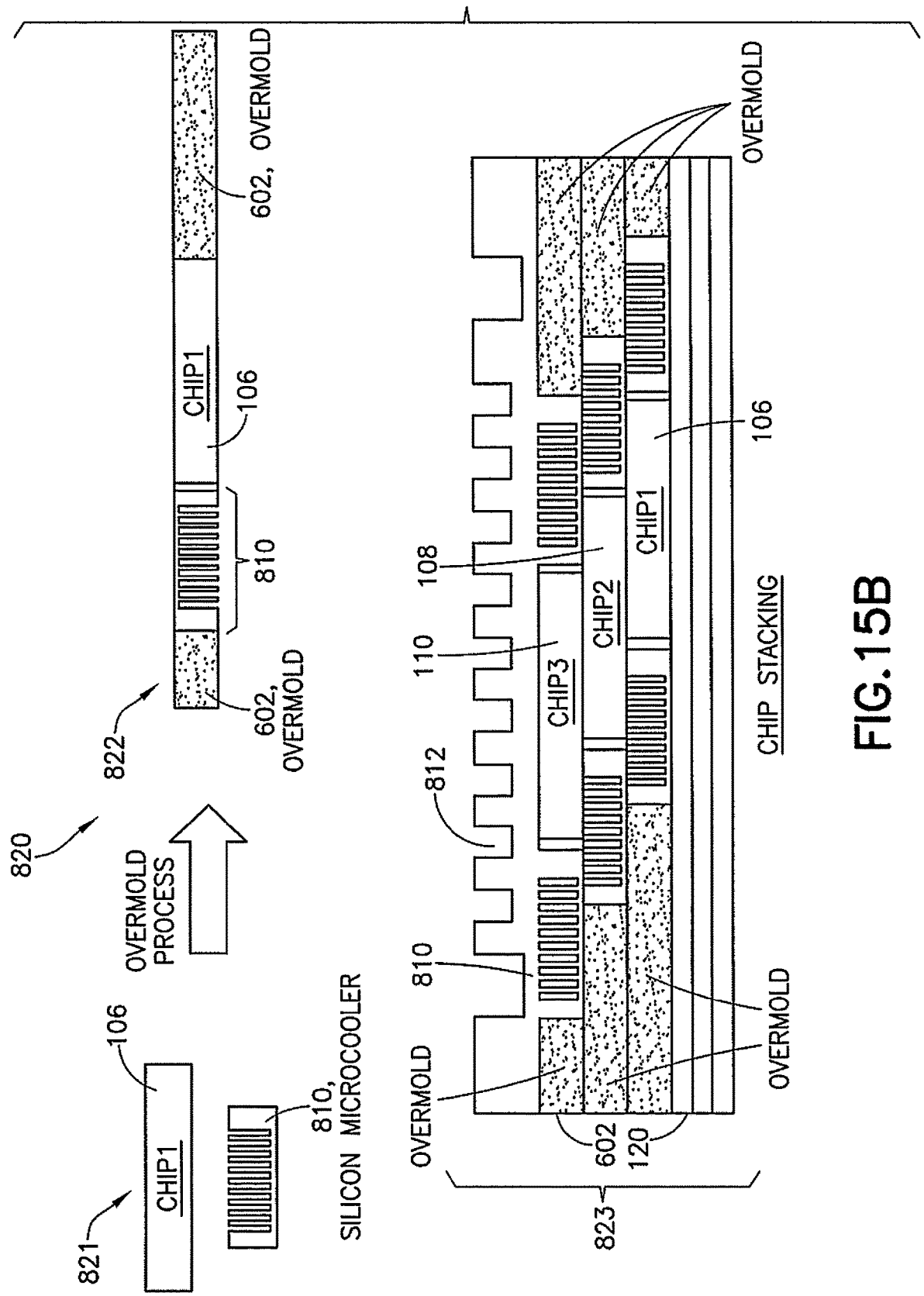
FIG. 15B shows another process to fabricate an embedded microcooler 3D chip stack.

FIG. 15B shows another process 820 to fabricate an embedded microcooler 3D chip stack. In process 820, the chips are offset. At 821, a plurality of chips, including chip1 106 are fabricated, and a plurality of silicon microcoolers 810 are fabricated. At 822, the microcoolers 810 are joined to one or both sides of the chips, and an overmold 602 is then applied on one or both sides of the resulting structure. For example, as shown in FIG. 15B, microcoolers 810 are applied to the left and right sides of each of the chips (106, 108, 110), followed by an overmold 602 being applied to the left and right sides of the resulting structure. However, different from the structures shown in FIG. 15A, because the chips are offset, the overmolds 602 have varying sizes across chips, and the overmolds 602 on opposite sides of the same chip can have varying sizes (as for chip1 106 and chip3 110) or substantially similar size (as for chip2 108). At 823, the chips (106, 108, 110) are stacked onto the laminate 120, as shown. Etches 812 are also fabricated into the stack for further layering of material.

Figure 15C:
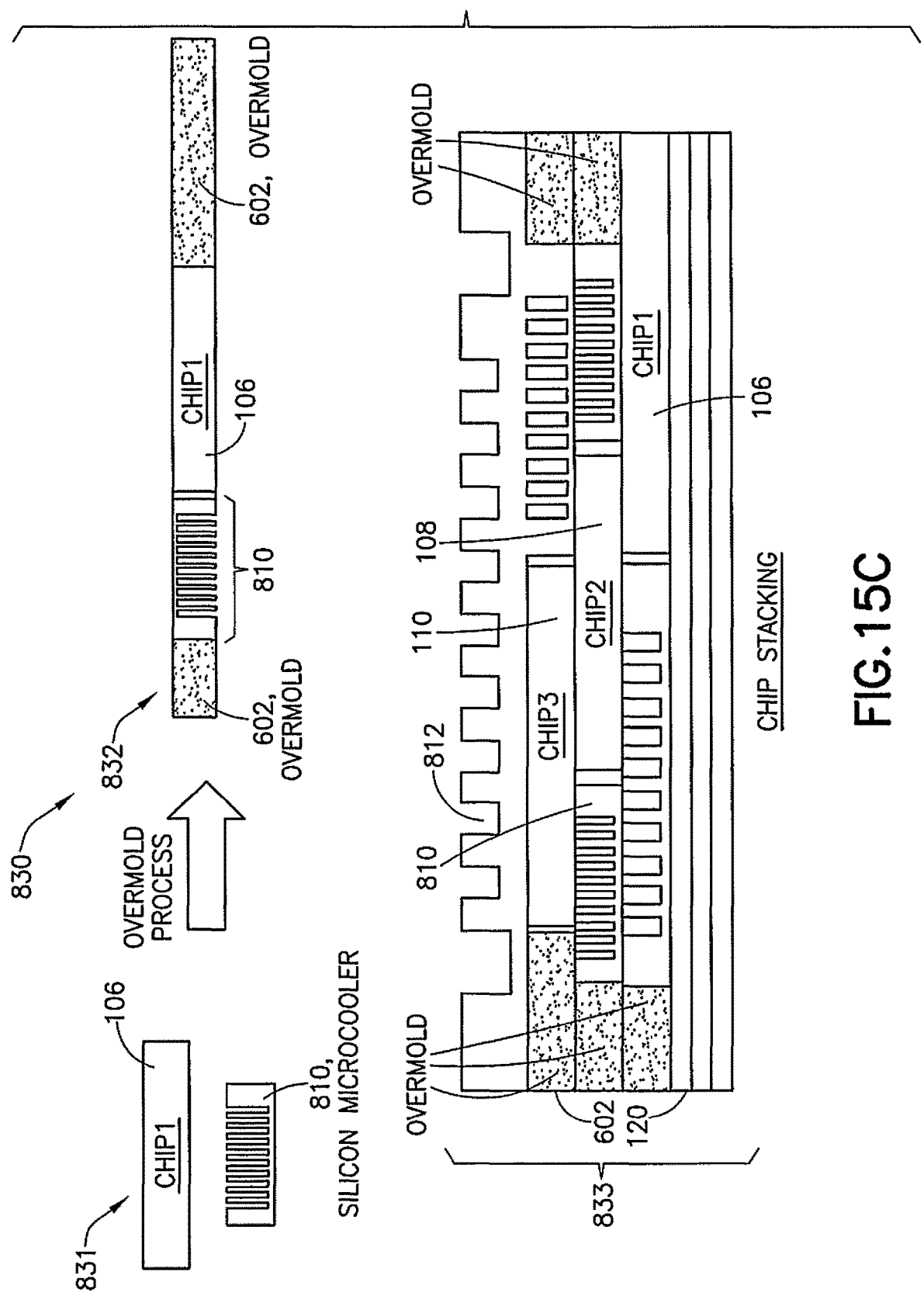
FIG. 15C shows another process to fabricate an embedded microcooler 3D chip stack.

FIG. 15C shows another process 830 to fabricate an embedded microcooler 3D chip stack. In process 830, the chips are offset. Different from FIG. 15B, in FIG. 15C an overmold is not applied to the left side of chip1 106, the microcoolers are of different sizes to facilitate the offsetting of the chips, and the overmold 602 on the right side of chip3 110 is larger than the overmolds on the right side of chip1 106 and chip2 108, due to there not being a microcooler joined on the right side of chip3 110. Because the overmold 602 on the right side of chip3 110 is larger than the overmold 602 on the right side of chip1 106, and because there is no overmold 602 on the left side of chip1 106, the microcooler 810 on the right side of chip1 106 is of a different size than the microcooler 810 on the left side of chip3 110. Thus, various sizes and configurations of the overmolds 602 and the microcoolers 810 may be implemented to facilitate the offsetting of the chips within the 3D stacked chips structure (e.g. 100).

At 831, a plurality of chips, including chip1 106 are fabricated, and a plurality of silicon microcoolers 810 are fabricated. At 832, the microcoolers 810 are joined to one or both sides of the chips, and an overmold 602 is then applied on one or both sides of the resulting structure. For example, as shown in FIG. 15C, a microcooler 810 is applied to the right side of chip1 106, followed by an overmold 602 being applied to the right side of the microcooler 810. A microcooler 810 is not applied to the left side of chip1 106, and an overmold is not applied to the left side of chip1 106. A microcooler 810 is applied to left side of chip2 108, and another microcooler 810 of substantially similar size is applied to the right side of chip2 108, followed by an overmold 602 being applied to the left of the microcooler 810 and to the right of the another microcooler 810, where the overmolds 602 are of substantially similar size. A microcooler 810 is applied to the left side of chip3 110, followed by an overmold 602 being applied to the left side of the microcooler 810 and to the right side of the chip3 110. At 833, the chips (106, 108, 110) are stacked onto the laminate 120, as shown. Etches 812 are also fabricated into the stack for further layering of material.

Figure 16:
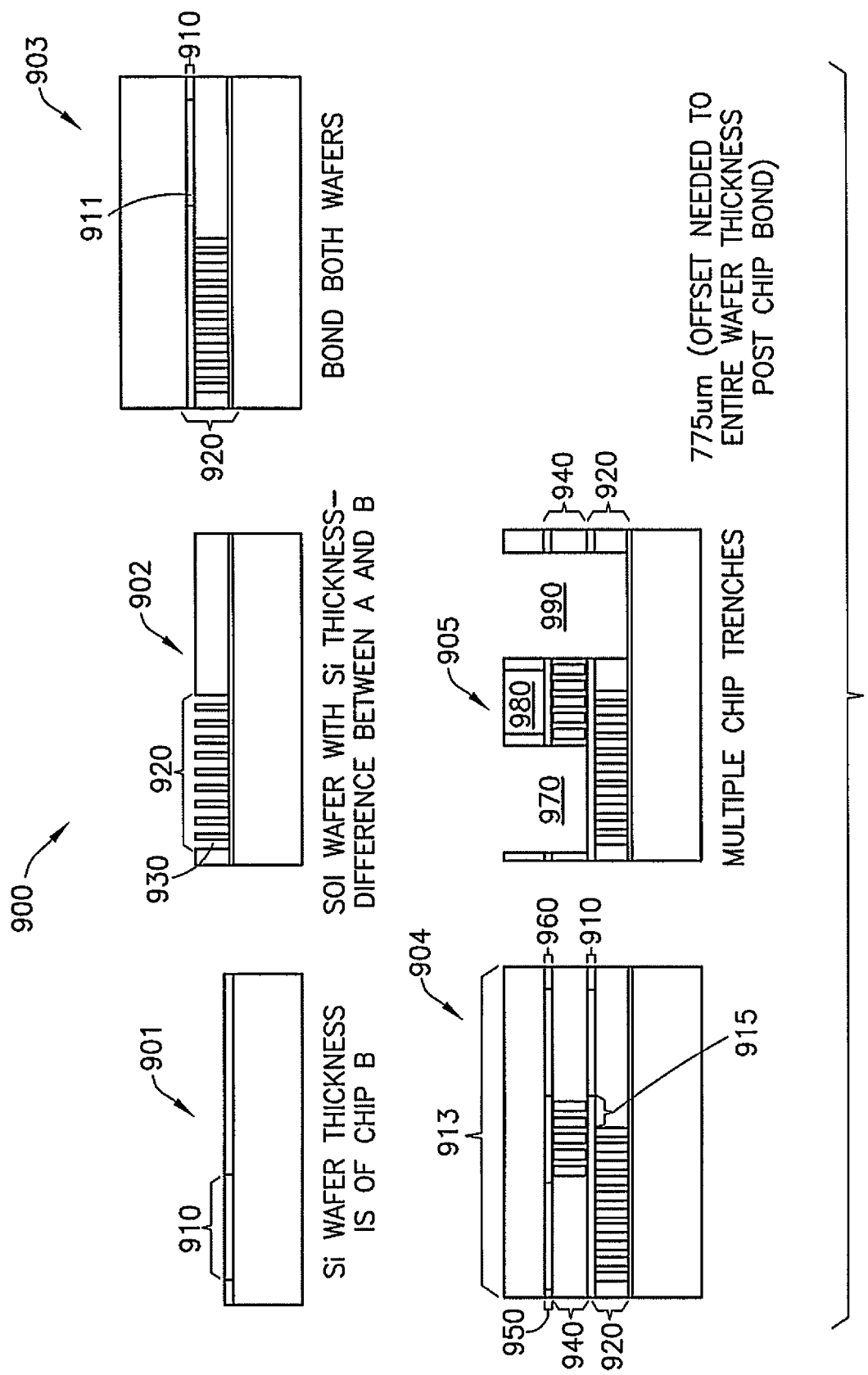
FIG. 16 shows a process flow for a possible Si based lid with micro-cooler channels.

FIG. 16 shows a process flow 900 for a possible Si based lid with micro-cooler channels. The process flow 900 shown in FIG. 16 is for buried oxide, multiple chips, and embedded micro-coolers. At 901, an Si wafer 910 is fabricated, where the Si wafer has a thickness of chip B. At 902, a silicon on insulator (SOI) wafer 920 is fabricated, where the SOI wafer 920 has Si thickness, or the difference of chip A and chip B. SOI wafer 920 has a plurality of channels 930. At 903, the Si wafer 910 is bonded (911) to the SOI wafer 920. Either at 903 or 904, a second bonding occurs, where two additional Si wafers (950, 960) are bonded to an additional SOI wafer 940, such that the SOI wafer 940 is offset, with offset 915, from the SOI wafer 920. At 905, multiple chip trenches (970, 980, 990) are etched. The dimension of the offset 915 is configured as needed to have the entire wafer thickness (913) post chip bond.

Figure 17:
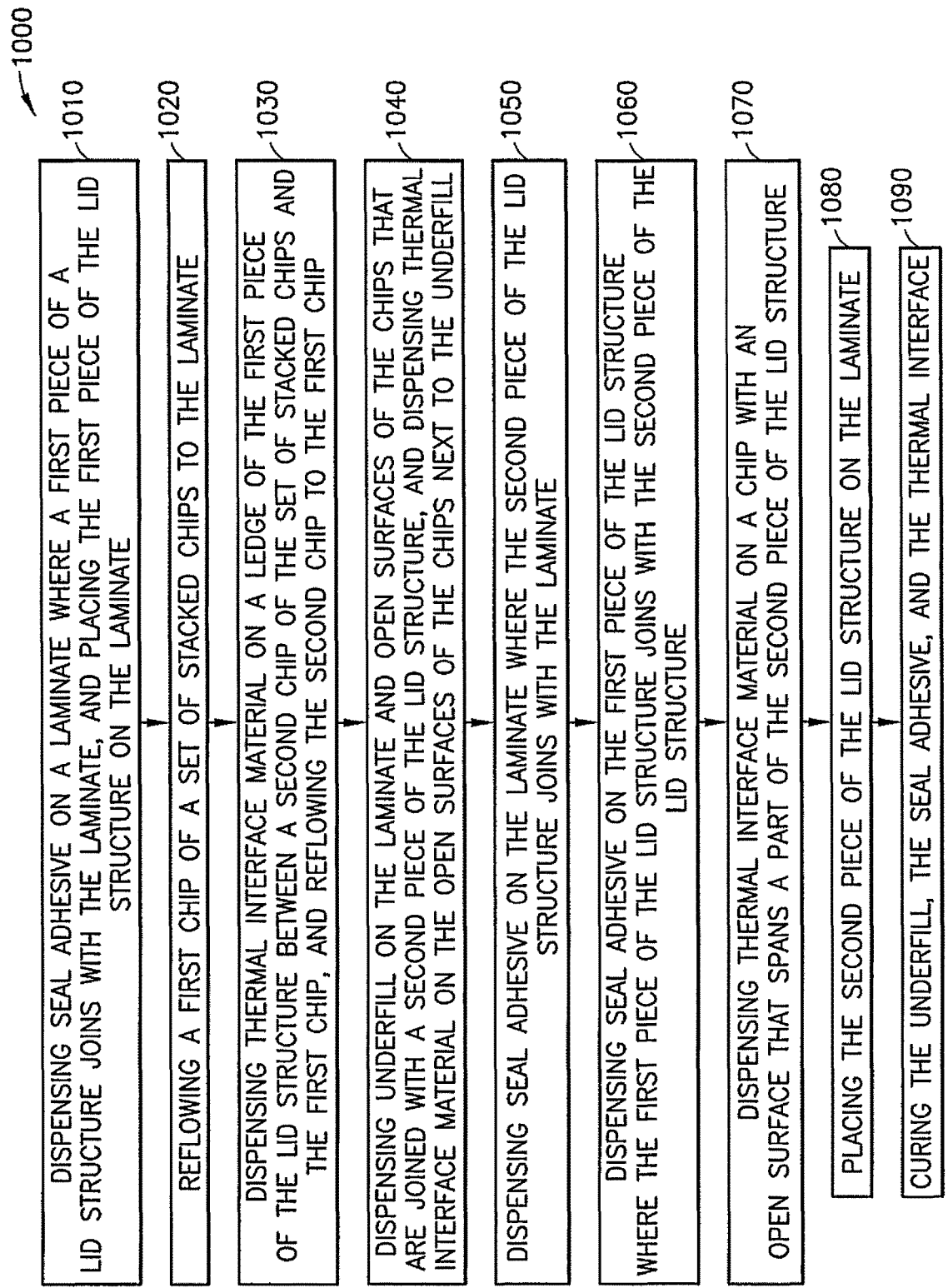
FIG. 17 is a logic flow diagram that illustrates the operation of a method to fabricate a structure with offset stacked chips with a top and bottom side cooling lid.

The various blocks of method 1000 shown in FIG. 17 may be viewed as method steps, and/or as operations that result from a lithographic process, and/or a topological process, and/or the operation of computer program code, and/or as a plurality of coupled logic circuit elements constructed to carry out the associated function(s). The blocks of method 1000 may be performed with different devices, such as with different computer program code implemented with the different devices.

At 1010, the method includes dispensing seal adhesive on a laminate where a first piece of a lid structure joins with the laminate, and placing the first piece of the lid structure on the laminate. At 1020, the method includes reflowing a first chip of a set of stacked chips to the laminate. At 1030, the method includes dispensing thermal interface material on a ledge of the first piece of the lid structure between a second chip of the set of stacked chips and the first chip, and reflowing the second chip to the first chip. At 1040, the method includes dispensing underfill on the laminate and open surfaces of the chips that are joined with a second piece of the lid structure, and dispensing thermal interface material on the open surfaces of the chips next to the underfill. At 1050, the method includes dispensing seal adhesive on the laminate where the second piece of the lid structure joins with the laminate. At 1060, the method includes dispensing seal adhesive on the first piece of the lid structure where the first piece of the lid structure joins with the second piece of the lid structure. At 1070, the method includes dispensing thermal interface material on a chip with an open surface that spans a part of the second piece of the lid structure. At 1080, the method includes placing the second piece of the lid structure on the laminate. At 1090, the method includes curing the underfill, the seal adhesive, and the thermal interface material.

Figure 18:
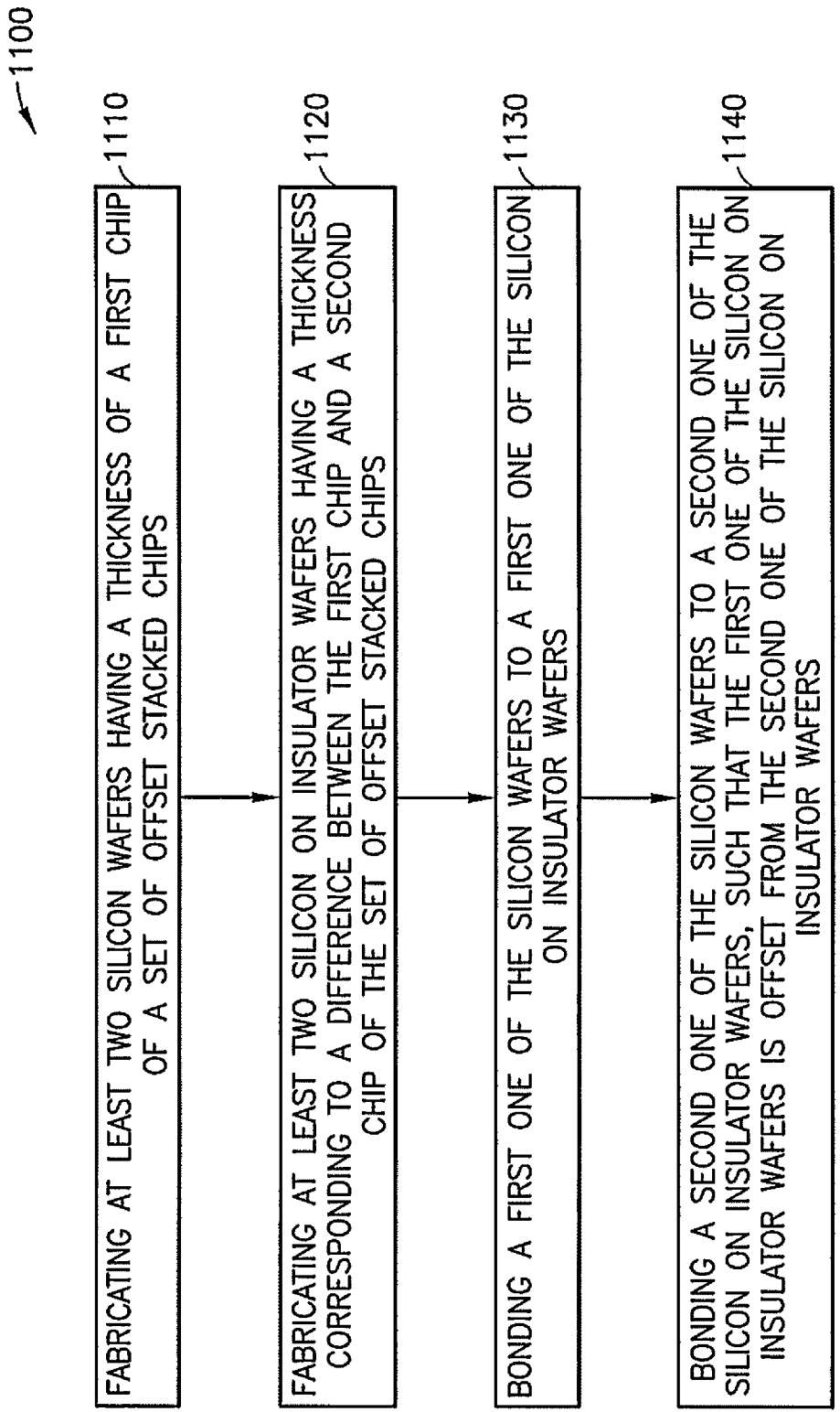
FIG. 18 is a logic flow diagram that illustrates the operation of a method for an Si based lid with micro-cooler channels.

FIG. 18 is a logic flow diagram that illustrates the operation of a method 1100 for an Si based lid with micro-cooler channels. At 1110, the method includes fabricating at least two silicon wafers having a thickness of a first chip of a set of offset stacked chips. At 1120, the method includes fabricating at least two silicon on insulator wafers having a thickness corresponding to a difference between the first chip and a second chip of the set of offset stacked chips. At 1130, the method includes bonding a first one of the silicon wafers to a first one of the silicon on insulator wafers. At 1140, the method includes bonding a second one of the silicon wafers to a second one of the silicon on insulator wafers, such that the first one of the silicon on insulator wafer is offset from the second one of the silicon on insulator wafer.

There are several technical effects and high value attributes of the described structures. Among these effects include enhanced cooling due to heat extraction from both sides of chips in a 3D chip stack.

Referring now to all the Figures, in one exemplary embodiment, an electronic structure includes offset three-dimensional stacked chips; and a two-piece lid structure configured to extract heat from the bottom and top of the stacked chips.

The electronic structure may further include thermal interface material between exposed surfaces of the chips and top surfaces of a bottom piece of the lid structure. The electronic structure may further include plated regions of top surfaces of a bottom piece of the lid structure, wherein solder bumps from overhanging regions of the stacked chips reflow to the plated regions of the top surfaces of the bottom piece of the lid structure. The electronic structure may further include wherein the stacked chips are offset in one direction, two directions, or in multiple directions. The electronic structure may further include wherein the two-piece lid structure comprises microchannels for fluid convection to further extract heat from the stacked chips. The electronic structure may further include wherein at least one of the stacked chips are hybrid bonded to another one of the stacked chips. The electronic structure may further include wherein at least one of the stacked chips is wirebonded to another one of the stacked chips, and at least one of the stacked chips is wirebonded to a substrate that carries the electronic structure. The electronic structure may further include an overmold applied to at least one side of at least one of the chips; and a plurality of through vias within the overmold configured to extract heat from the stacked chips. The electronic structure may further include at least one microcooler connected to at least one side of the stacked chips, wherein the at least one microcooler provides active thermal management; and overmold applied to a side of the at least one microcooler, wherein a size of the overmold facilitates offsetting of the stacked chips. The electronic structure may further include wherein two or more of the microcoolers are of different sizes to facilitate offsetting of the chips. The electronic structure may further include wherein the overmold is applied to a first side of one of the chips, and the overmold is applied to a second side of the one of the chips, the overmold applied to the first side being of a different size than the overmold to applied to the second side, to facilitate offsetting of the chips.

In another exemplary embodiment, a method includes dispensing seal adhesive on a laminate where a first piece of a lid structure joins with the laminate, and placing the first piece of the lid structure on the laminate; reflowing a first chip of a set of stacked chips to the laminate; dispensing thermal interface material on a ledge of the first piece of the lid structure between a second chip of the set of stacked chips and the first chip, and reflowing the second chip to the first chip; dispensing underfill on the laminate and open surfaces of the chips that are joined with a second piece of the lid structure, and dispensing thermal interface material on the open surfaces of the chips next to the underfill; dispensing seal adhesive on the laminate where the second piece of the lid structure joins with the laminate; dispensing seal adhesive on the first piece of the lid structure where the first piece of the lid structure joins with the second piece of the lid structure; dispensing thermal interface material on a chip with an open surface that spans a part of the second piece of the lid structure; placing the second piece of the lid structure on the laminate; and curing the underfill, the seal adhesive, and the thermal interface material.

The method may further include stacking the chips offset from one another. The method may further include repeating the dispensing of the thermal interface material on another ledge of the first piece of the lid structure between two chips of the set of stacked chips, and reflowing between the two chips, until the chips within the stack have been reflown with at least one other chip. The method may further include forming a grid array on a first side of the laminate opposite a second side of the laminate connected to the lid structure. The method may further include marking the lid structure. The method may further include applying an overmold to at least one side of at least one of the chips; and inserting a plurality of through vias within the overmold to extract heat from the stacked chips. The method may further include connecting at least one microcooler to at least one side of the stacked chips, wherein the at least one microcooler provides active thermal management; and applying overmold to the at least one microcooler, wherein a size of the overmold facilitates offsetting of the stacked chips.

In another exemplary embodiment, a method includes fabricating at least two silicon wafers having a thickness of a first chip of a set of offset stacked chips; fabricating at least two silicon on insulator wafers having a thickness corresponding to a difference between the first chip and a second chip of the set of offset stacked chips; bonding a first one of the silicon wafers to a first one of the silicon on insulator wafers; and bonding a second one of the silicon wafers to a second one of the silicon on insulator wafers, such that the first one of the silicon on insulator wafer is offset from the second one of the silicon on insulator wafer.

The method may further include etching multiple trenches adjacent to at least one chip of the set of stacked chips.

References to a 'computer', 'processor', etc. should be understood to encompass not only computers having different architectures such as single/multi-processor architectures and sequential or parallel architectures but also specialized circuits such as field-programmable gate arrays (FPGAs), application specific circuits (ASICs), signal processing devices and other processing circuitry. References to computer program, instructions, code etc. should be understood to encompass software for a programmable processor or firmware such as, for example, the programmable content of a hardware device whether instructions for a processor, or configuration settings for a fixed-function device, gate array or programmable logic device etc.

The memory(ies) as described herein may be implemented using any suitable data storage technology, such as semiconductor based memory devices, flash memory, magnetic memory devices and systems, optical memory devices and systems, non-transitory memory, transitory memory, fixed memory and removable memory. The memory(ies) may comprise a database for storing data.

As used herein, circuitry may refer to the following: (a) hardware circuit implementations, such as implementations in analog and/or digital circuitry, and (b) combinations of circuits and software (and/or firmware), such as (as applicable): (i) a combination of processor(s) or (ii) portions of processor(s)/software including digital signal processor(s), software, and memory(ies) that work together to cause an apparatus to perform various functions, and (c) circuits, such as a microprocessor(s) or a portion of a microprocessor(s), that require software or firmware for operation, even if the software or firmware is not physically present. As a further example, as used herein, circuitry would also cover an implementation of merely a processor (or multiple processors) or a portion of a processor and its (or their) accompanying software and/or firmware. Circuitry would also cover, for example and if applicable to the particular element, a baseband integrated circuit or applications processor integrated circuit for a mobile phone or a similar integrated circuit in a server, a cellular network device, or another network device.

LIST OF ABBREVIATIONS 2D two-dimensional
3D three-dimensional
ASIC application-specific integrated circuit
BGA ball grid array
C4 controlled collapse chip connection
FPGA field-programmable gate array
incl. including
LGA land grid array
SOI silicon on insulator
Ta ambient temperature
TIM thermal interface material
TMV through mold via In the foregoing description, numerous specific details are set forth, such as particular structures, components, materials, dimensions, processing steps, and techniques, in order to provide a thorough understanding of the exemplary embodiments disclosed herein. However, it will be appreciated by one of ordinary skill of the art that the exemplary embodiments disclosed herein may be practiced without these specific details. Additionally, details of well-known structures or processing steps may have been omitted or may have not been described in order to avoid obscuring the presented embodiments.

The description of the present invention has been presented for purposes of illustration and description, but is not intended to be exhaustive or limiting in the form disclosed. Many modifications and variations will be apparent to those of ordinary skill in the art without departing from the scope of the invention. The embodiments were chosen and described in order to best explain the principles of the invention and the practical applications, and to enable others of ordinary skill in the art to understand the invention for various embodiments with various modifications as are suited to the particular uses contemplated.

What is claimed is:

1. An electronic structure comprising:
   three-dimensional chips arranged in a stack, wherein at least one chip of the three-dimensional chips is offset by at least one distance relative to another chip of the stack such that the at least one chip has an exposed surface not covered with the another chip; and
   a two-piece lid structure configured to extract heat from the bottom and top of the stacked chips;
   wherein at least one ledge of at least one piece of the two-piece lid structure covers the exposed surface, and a thermal interface material is applied between the at least one ledge of the at least one piece of the two-piece lid structure and the exposed surface.

2. The electronic structure of claim 1, further comprising thermal interface material between exposed surfaces of the chips and surfaces of ledges of the lid structure.

3. The electronic structure of claim 1, further comprising a carrier or substrate, wherein a first piece of the two-piece lid structure is connected to a surface of the carrier or substrate on one side of the stack, and a second piece of the two-piece lid structure is connected to the surface of the carrier or substrate on another side of the stack.

4. The electronic structure of claim 1, wherein the stacked chips are offset in one direction.

5. The electronic structure of claim 1, wherein the two-piece lid structure comprises microchannels for fluid convection to further extract heat from the stacked chips.

6. The electronic structure of claim 1, wherein at least one of the stacked chips are hybrid bonded to another one of the stacked chips.

7. The electronic structure of claim 1, wherein at least one of the stacked chips is wirebonded to another one of the stacked chips, and at least one of the stacked chips is wirebonded to a substrate that carries the electronic structure.

8. The electronic structure of claim 1, further comprising:
   an overmold applied to at least one side of at least one of the chips; and
   a plurality of through vias within the overmold configured to extract heat from the stacked chips.

9. The electronic structure of claim 1, further comprising:
   at least one microcooler connected to at least one side of the stacked chips, wherein the at least one microcooler provides active thermal management; and
   overmold applied to a side of the at least one microcooler, wherein a size of the overmold facilitates offsetting of the stacked chips.

10. The electronic structure of claim 9, wherein two or more of the microcoolers are of different sizes to facilitate offsetting of the chips.

11. The electronic structure of claim 9, wherein a first overmold is applied to a first side of one of the chips, and a second overmold is applied to a second side of the one of the chips, the first overmold applied to the first side being of a different size than the second overmold to applied to the second side.

12. The electronic structure of claim 1, wherein the at least one distance by which the at least one chip is offset relative to the another chip of the stack is between one-twentieth of a width of the at least one chip and one-half of the width of the at least one chip.

13. The electronic structure of claim 1, wherein the at least one distance between the at least one ledge of the at least one piece of the two-piece lid structure and the exposed surface of the at least one chip where the thermal interface material is applied is between 30 micrometers and 50 micrometers.

14. The electronic structure of claim 1, wherein:
   a distance between a ledge of a first piece of the two-piece lid structure and an exposed surface of a first chip where thermal interface material is applied is between 30 micrometers and 50 micrometers; and
   a distance between a ledge of a second piece of the two-piece lid structure and an exposed surface of a second chip where thermal interface material is applied is between 30 micrometers and 50 micrometers.

15. The electronic structure of claim 9, wherein a first microcooler is applied to a first side of one of the chips, and a second microcooler is applied to a second side of the one of the chips.

16. The apparatus of claim 15, wherein a third microcooler is applied to a first side of another one of the chips, and a fourth microcooler is applied to a second side of the another one of the chips.

17. The electronic structure of claim 1, wherein the at least one chip is offset by a first distance relative to the another chip in a first direction, and the at least one chip is offset by a second distance relative to the another chip in a second direction different from the first direction.

18. The electronic structure of claim 1, wherein:
   a first chip of the stack is offset by a first distance relative to a second chip of the stack in a first direction, and the first chip is offset by a second distance relative to the second chip in a second direction different from the first direction; and
   a third chip of the stack is offset by a third distance relative to the second chip in a third direction opposite the first direction, and the third chip is offset by a fourth distance relative to the second chip in the second direction or a fourth direction different from the second direction.

19. The electronic structure of claim 1, wherein:
   a first piece of the two-piece lid structure is coupled to a second piece of the two-piece lid structure on one side of the stacked chips; and
   the first piece of the two-piece lid structure is not coupled to the second piece of the two-piece lid structure on another side of the stacked chips.

20. The electronic structure of claim 1, wherein the at least one ledge of the at least one piece of the two-piece lid structure projects from a portion of the at least one piece of the two-piece lid structure by a distance corresponding to the at least one distance by which at least one chip is offset relative to the another chip.

* * * * *